(12) United States Patent
Monestier et al.

(10) Patent No.: US 11,175,019 B2
(45) Date of Patent: Nov. 16, 2021

(54) CARRIER FOR LIGHTING MODULES AND LIGHTING DEVICE

(71) Applicant: LUMILEDS HOLDING B.V., Schiphol (NL)

(72) Inventors: Florent Grégoire Monestier, Kerkrade (NL); Michael Deckers, Jülich (DE)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/091,817

(22) Filed: Nov. 6, 2020

(65) Prior Publication Data

US 2021/0131646 A1 May 6, 2021

(30) Foreign Application Priority Data

Nov. 6, 2019 (EP) .................................... 19207423

(51) Int. Cl.
| | |
|---|---|
| F21V 15/01 | (2006.01) |
| F21V 29/503 | (2015.01) |
| F21K 9/90 | (2016.01) |
| F21V 23/00 | (2015.01) |
| F21Y 115/10 | (2016.01) |
| F21K 9/237 | (2016.01) |
| F21S 41/151 | (2018.01) |

(52) U.S. Cl.
CPC ............... *F21V 15/01* (2013.01); *F21K 9/90* (2013.01); *F21V 23/004* (2013.01); *F21V 29/503* (2015.01); *F21K 9/237* (2016.08); *F21S 41/151* (2018.01); *F21Y 2115/10* (2016.08)

(58) Field of Classification Search
None
See application file for complete search history.

(56) References Cited

U.S. PATENT DOCUMENTS

| | | | |
|---|---|---|---|
| 7,420,268 B2 * | 9/2008 | Chen .................. | F21K 9/00 257/686 |
| 2007/0080645 A1 | 4/2007 | Smith | |
| 2017/0146211 A1 | 5/2017 | Wu | |
| 2018/0283644 A1 | 10/2018 | Mertens et al. | |
| 2020/0084889 A1 * | 3/2020 | Epmeier .................. | F21K 9/23 |

FOREIGN PATENT DOCUMENTS

| | | |
|---|---|---|
| CN | 207602619 U | 7/2018 |
| JP | 2010198847 A | 9/2010 |
| WO | 2009/037645 A2 | 3/2009 |

OTHER PUBLICATIONS

Extended European Search Report dated Apr. 23, 2020 in EP Application No. 19207423.5.

* cited by examiner

Primary Examiner — Britt D Hanley
(74) Attorney, Agent, or Firm — Volpe Koenig

(57) ABSTRACT

The invention refers to a carrier for at least one lighting module, the carrier comprising: at least one mounting portion for receiving the at least one lighting module, wherein the carrier has a triangular cross section at least in sections with the at least one mounting portion being arranged on an edge of the triangular cross section; and a heat sink body portion arranged adjacent to the at least one mounting portion, wherein the heat sink body portion protrudes sidewards from the at least one mounting portion. The invention further relates to a lighting device and a method for producing such lighting device.

18 Claims, 15 Drawing Sheets

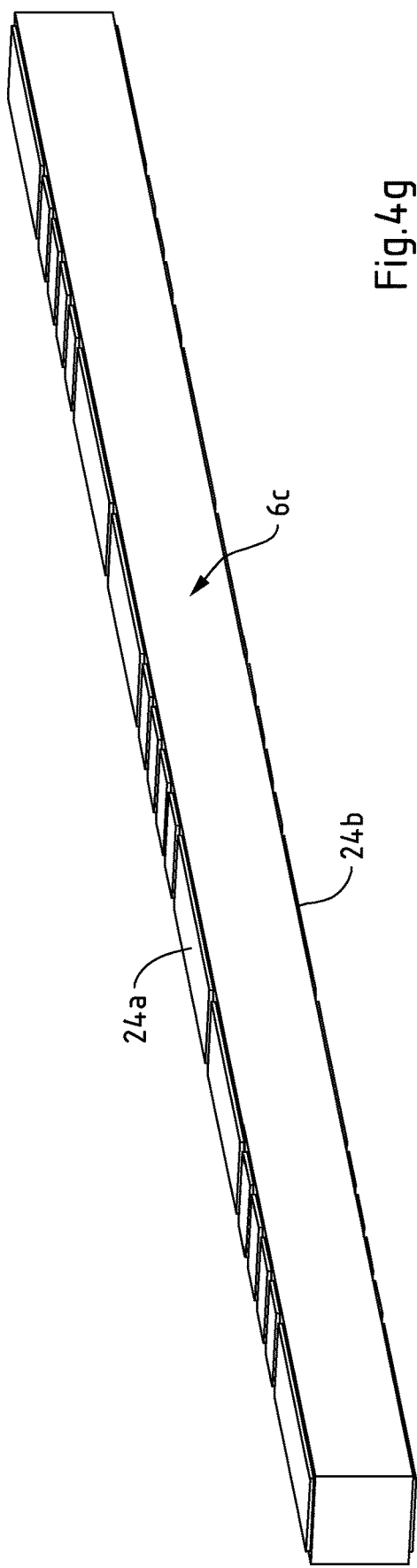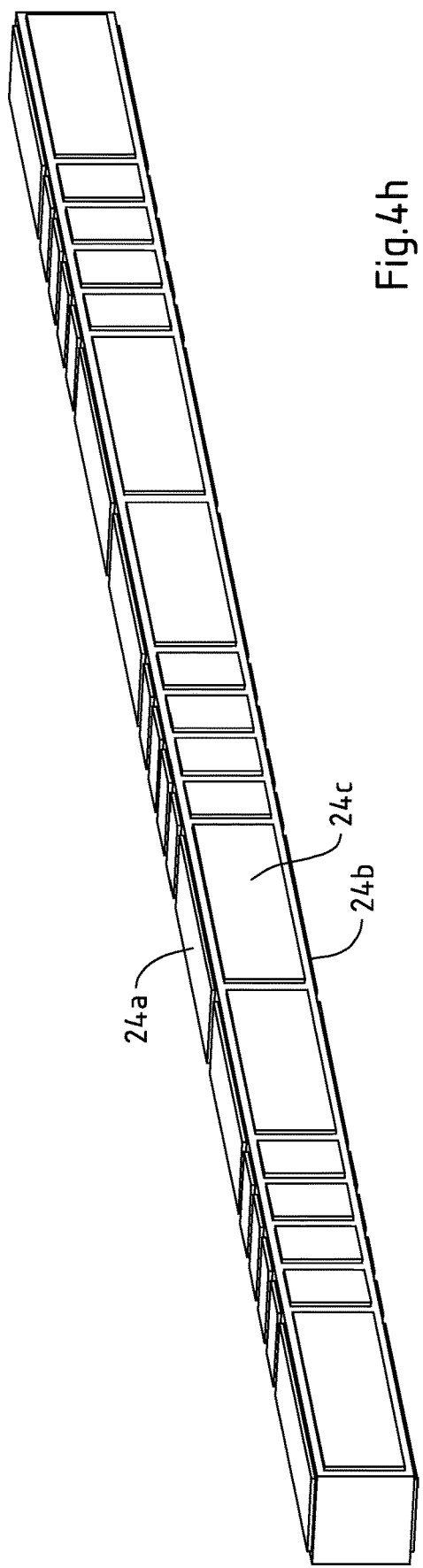

CARRIER FOR LIGHTING MODULES AND LIGHTING DEVICE

CROSS REFERENCE TO RELATED APPLICATION(S)

This application claims the benefit of EP Patent Application Serial No. 19207423.5, filed Nov. 6, 2019, which is incorporated by reference as if fully set forth.

FIELD OF INVENTION

The present disclosure relates to a carrier for lighting modules in a lighting device, in particular comprising a multisided structure for the lighting modules in applications such as automotive lighting.

BACKGROUND

Halogen lamps have been the default light source for many years for automotive head-lighting. However, current LED technology provides much better conversion efficiency and accurate beam pattern design possibilities. As a result, LED retrofit headlamps are seriously considered as legal replacement of halogen headlamps. Besides better energy efficiency and higher luminous flux, lifetime and low early mortality of LED headlamps are also much better.

Although the share of new cars originally equipped with full LED headlamps increases year after year, the cars in use equipped with halogen headlamps represent still more than 60% of the volume of headlamp bulbs in use. In terms of potential headlamp units replacement that means a very large potential market is available for retrofit headlamps.

It is required that LED retrofit lamps mimic the properties of their halogen counterparts in order to deliver at least equal performance while fulfilling all legal requirements without having to change the optics of the headlamp. One key attribute is the radiation characteristic of the light emitted by such retrofits.

Due to different characteristics between halogen lamps and LEDs, it's very challenging to fit 100% of the halogen headlamps features with a LED retrofit headlamp. The main difficulty for regulation of LED retrofit is to fit the same near-field (luminance image of the light source) and far-field (intensity profile) as its halogen counterpart. On one hand, the near field has to fit the luminance of a limited filament so typically a rod of approximately 4 mm length and 1.4 mm diameter. On the other hand, far field has to fit a 360° radial distribution of a filament or at least a 300° radial distribution. Taking into account the luminous flux, the light distribution and the limited space of the light emitting area, it is therefore very difficult to dissipate the heat produced by the LEDs properly. That is the reason why so far no fully legal commercial LED retrofit headlamp is available on the market.

To bypass the constraints listed above, a lot of non-legal LED retrofit headlamps have recently emerged. Those non-legal LED retrofit headlamps fulfil only a limited amount of halogen headlamp legal requirements. Typically, the requirements related to near emission field are not fulfilled and the luminous flux is considerably lower than the legal lumen requirement value as soon as the temperature exceeds a certain limit. Another drawback of current non-legal LED retrofit lamps is the excessive glare for some portions of the emission field which could be very dangerous for the other drivers of vehicles since they could be blinded.

With respect to the legal LED retrofit headlamps, there are not many ways to fulfil the legal radiation pattern requirements of halogen headlamps. The easiest way to mimic the radiation pattern of halogen headlamps is to use three-sided or even four-sided LED arrangements where many LEDs are connected in series, and, for thermal reasons, are placed on a heat sink, facing outwards. The main drawback of such arrangements is that if the legal near filed requirement has to be fulfilled, the wall thickness supporting the LEDs will have to be not more than 0.8 mm taking into account the thickness of a CSP (Chip Scale Package) with a converter coating. If considering a three-sided arrangement nose where LEDs are disposed on three sides on a metallic substrate, it will be very challenging to insulate the conductive tracks of the LEDs from the heat sink body and in the same time to have a good thermal connection between the LEDs and the heat sink.

Further, insulation between bottom pads of LEDs and the heat sink is challenging. This is particularly difficult to realize for typical bottom contact LED packages in which electrical pads are directly in contact with a body of a heat sink.

SUMMARY

It is an object of the present invention to provide a carrier for at least one lighting module that provides effective heat transport and electrical conduction when the lighting module is arranged on a multisided structure of the carrier.

According to a first aspect of the present invention, a carrier for at least one lighting module is proposed, the carrier comprising: at least one mounting portion for receiving of the at least one lighting module, wherein the at least one mounting portion has a triangular cross section at least in sections with the at least one mounting portion being arranged on an edge of the triangular cross section; and a heat sink body portion arranged adjacent to the at least one mounting portion, wherein the heat sink body portion protrudes sidewards from the at least one mounting portion.

According to a second aspect of the present invention, a lighting device is proposed comprising: a carrier according to the first aspect of the invention; and at least one structure comprised by the at least one mounting portion for receiving the at least one lighting module, wherein the at least one structure comprises at least three mounting faces for receiving a respective at least one lighting module on each of the at least three mounting faces, wherein each of the at least three mounting faces has an arrangement direction and is configured for the at least one lighting module arranged along the arrangement direction, and at least one lighting module mounted along the arrangement direction of each of the at least three mounting faces.

According to a third aspect of the present invention, a method for producing a lighting device is proposed, in particular a lighting device according to the second aspect of the invention, the method comprising: providing a carrier according to the first aspect of the invention; forming or mounting at least one structure to the at least one mounting portion of the carrier, wherein the at least one structure is thermally coupled to the at least one at least one mounting portion; mounting at least one lighting module along the arrangement direction of each the at least three mounting faces to the at least one structure.

Exemplary embodiments of the first, second, and third aspect of the invention may have one or more of the properties described below.

The carrier comprises a mounting portion with at least three mounting face. The mounting face(s) may provide a suitable mounting surface for one or more lighting modules. For instance, the mounting face(s) may be at least partially flat or planar to provide an area suitable to accommodate at least one lighting module, such as an LED die.

The lighting module may in particular comprise at least one semiconductor element capable of light emission. In particular, the lighting module may comprise at least one LED. LEDs may comprise the semiconductor element such as a p-n-junction, a diode, and/or a transistor. For instance, the LEDs may be provided in form of separate or combined LED dies and/or LED packages, wherein particular the LED may be arranged on a substrate, e.g. a sapphire substrate. An LED package may comprise a wavelength conversion element (e.g. based on phosphor) and/or may comprise at least one optical element such as a diffusing layer, a diffractive element (e.g. a lens) and/or a reflective element (e.g. a reflector cup). The LED or LEDs may for instance be integrated into an LED lead frame.

The mounting face(s) has (have) an arrangement direction that is configured for accommodating the lighting module arranged along the arrangement direction. The arrangement direction may correspond to an extension direction of the respective mounting face and/or of the lighting module. For instance, the arrangement direction may correspond to a longest dimension of the respective mounting face and/or of lighting module. The respective mounting face(s) may in particular be configured such that multiple lighting modules, e.g. in form of a lighting module package, may be arranged along a line, e.g. a straight line, wherein the arrangement direction corresponds to the orientation of the line of lighting modules. The lighting device may be configured that at least one lighting module of the multiple lighting modules arranged along the arrangement direction are configured to emit light of a different intensity than at least one other lighting module of the multiple lighting modules arranged along the same arrangement direction. For instance, one or more lighting modules of the multiple lighting modules may enable the function of low beam, and one or more other lighting modules of the multiple lighting modules may enable the function of high beam. Further, that lighting modules mounted to one mounting face can emit light of different intensity may apply to at least one, two, or to all three of the mounting faces that comprise multiple lighting modules. In this way, a dual function lamp with low beam (light) and high beam (light) is enabled. Such a dual function lamp may be used as a retrofit lamp, e.g. in an automotive headlamp appliance.

The heat sink body portion is arranged adjacent to the mounting portion, wherein in particular the heat sink body portion is in thermal contact to the mounting section, such that heat generated by one or more lighting module mounted on the respective mounting face(s) can be transferred from the mounting portion to the heat sink body portion. The heat sink body portion may in particular comprise a volume and/or surface configured to provide heat dissipation suitable for the heat generated by lighting module(s) and to provide cooling for the lighting module(s).

A respective mounting face of the at least three mounting faces comprises at least two contact sections along the arrangement direction. Such contact sections may for example be configured as contact patches or contact areas or contact sections on the surface of the mounting face(s) that allow for an electrical contact with the lighting module, for instance by soldering or by means of a conductive adhesive enabling also thermal connection. Each of such a contact section may correspond to a conductor and may therefore be electrically connected to a driver, such that a for instance a voltage may be applied between neighboring contact sections when e.g. the contact section(s) is (are) connected to a power source. Each neighboring contact section may further be separated by an insulating section.

As already mentioned above, the heat sink body portion may provide an electrical and/or thermal connection to the mounting portion. Further, it may act simultaneously as a heat sink respectively heat conductor, which is particularly advantageous when the lighting module with a high heat output is used, e.g. LED light sources for high current applications such as automotive head lighting. As the heat sink body portion protrudes sidewards from the mounting portion, in particular the volume of the heat sink body portion may be enlarged, and the heat sink body portion provides significantly improved heat transfer from the mounting section. The electrical conductivity may also be improved due to an enlarged cross section of the conductors, allowing to supply the light-emitting elements accommodated on the at least three mounting faces with high currents. Further, it has been found that the carrier according to the invention may allow for a close mimicking of the illumination of traditional light sources such as in-candescent light sources based on a filament. In particular, the illumination pattern of light sources such as halogen bulbs may be reproduced very closely with such lighting modules (e.g. at least one LED) based on the carrier. Hence, the carrier according to invention may provide an optimization of optical, thermal, and electrical aspects of retrofitting light sources.

Under "protruding sidewards", it may in particular be understood that when a viewer faces a respective mounting surface of the at least three mounting faces (for instance in a direction perpendicular to the surface of the mounting face), the heat sink body portion extends at least beyond one edge of the respective mounting face. For instance, the heat sink body portion may protrude sidewards relative to the arrangement direction in that the heat sink body portion extends beyond at least one edge of a respective mounting face. The edge may extend substantially parallel to the arrangement direction.

The mounting portion may also be part of a nose of the carrier. The heat sink body portion and/or the mounting portion may have at least in sections an increasing cross-sectional area with increasing distance from the mounting section. With this, the optical properties of a lighting device based on the carrier of the first aspect may be further improved in that a smaller amount of light emitted by the lighting module accommodated in the mounting portion is blocked by the heat sink body portion, while the heat sink body portion may be provided with a high volume and surface area to optimize the thermal properties. In particular, when a triangular cross section is provided at least in sections with the mounting portion being arranged on an edge of the triangular cross section (e.g. of the nose), the volume and surface area of the heat sink body portion and/or the nose at least in this part is enhanced. The nose of the carrier may have e.g. a v-shaped form.

According to an exemplary embodiment of the invention, the triangular cross section has an opening angle of 0° to 90°, in particular 30° to 65°, preferably 58°. Thus, the mounting portion or the nose of the carrier has at least in sections an increasing cross-sectional area with increasing distance from the mounting portion. It is tolerated that no light is radiated in the angular range corresponding to the back lead wire of halogen lamps. Since it is foreseen that for a plane orthogonal with the main axis of an automotive headlamp, the minimum luminous intensity will be defined starting from C30-plane. For instance, no light has to be emitted for an angular between −29° to +29°. In case the heat sink body portion is a truncated heat sink body portion (e.g. in the form of a nose), shadowing LED light radiation over 59° angular range is within regulation requirements for the LED retrofit headlamp, in particular for automotive lighting appliances. Such a truncated heat sink body portion may be used to support the lighting module and to transport the heat as well.

In the range of abovementioned opening angle, thermal properties of the heat sink body portion are considered to be sufficient for many applications while providing an angle of illumination that is suitable in particular for retrofitting applications is achieved. When an opening angle in the range of 30° to 65° (e.g. of the nose) is chosen, the angle of illumination may be improved. For applications with higher heat generation requiring a higher heat transfer from the mounting portion to the heat sink body portion, opening angles in particular about 58° have been found to be preferred. In this way, the (e.g. truncated) heat sink body portion (e.g. the nose) of the carrier, shadows light radiation over 58° angular range. The amount of light blocked or reflected by the heat sink body portion can thus be controlled by choosing an appropriate opening angle of the triangular cross section. As shown, the opening angle of the triangular cross section may for instance be chosen for a large volume of the heat sink body portion, e.g. by a larger opening angle, or larger angles of illumination, e.g. by a smaller opening angle.

According to an exemplary embodiment of the invention, the at least three mounting faces being arranged adjacent to each other; and/or the at least three mounting faces are arranged at an angle to each other or substantially parallel to each other.

By using at least three or multiple mounting faces, the illumination provided by a filament can be mimicked with higher precision. For instance, the arrangement direction of each mounting face may be substantially parallel to each other, wherein the mounting faces represent different sides of the filament. In particular, at least two mounting faces can be arranged adjacent to each other, such that a continuous area for mounting light-emitting elements is obtained.

One of the at least three mounting faces may be arranged between the other two mounting Faces and may optionally be arranged directly adjacent to the other two mounting faces. The mounting portion may for example comprise four sides, with three sides of it providing the at least mounting faces. A fourth side provides contact to the heat sink body portion.

According to an exemplary embodiment of the invention, the at least three mounting faces being arranged with an enclosing angle of 45° to 135°, in particular 45° to 75° or substantially perpendicular to the other two mounting faces. A respective mounting face is configured for accommodating at least one lighting module, in particular multiple lighting modules (e.g. in form of a package) arranged along the arrangement direction. The lighting modules may for example be arranged along the arrangement direction in a line, in particular in a straight line to represent the extension direction of a filament. A respective mounting face may comprise at least alternating contact sections along the arrangement direction, e.g. each alternating contact section corresponding to a conductor and being separated by an insulating section. In an embodiment according to all aspects, the alternating contact sections are configured to provide alternating polarities. For instance, the polarities between neighboring contact sections are reversed in respect to each other (such as sequences like +/−/+ or −/+/−. The lighting modules may be brought into contact to two contacting sections with different polarities, e.g. lighting modules may be brought into contact to two neighboring alternating contacting sections to be driven.

For example, multiple lighting modules may be arranged along the arrangement direction in a line, e.g. in a "1×N"-configuration. Each lighting module of the "1×N"-configuration arranged along the arrangement direction may be in contact to a different pair of alternating contact sections. Configurations with multiple lighting modules being in contact to the same pair of alternating contact sections are also possible, e.g. for arrays of light-emitting elements such as "2×N"-configurations, "3×N"-configurations or even larger arrays, to name but a few non-limiting examples.

According to an exemplary embodiment of the invention, the carrier further comprises at least one cavity for receiving at least one circuit board to be electrically coupled to the at least one lighting module. The cavity may be a slot.

According to an exemplary embodiment of the invention, the method further comprises: arranging a circuit board in at least one cavity of the carrier, and electrically coupling a first lighting module and a last lighting module of the three lighting module packages with the circuit board. The circuit board may be arranged by placing or sliding the circuit board in the cavity.

The cavity may in particular be an opening, and may comprise a contact region, in particular a contact plane on which the circuit board may be easily mounted, for instance in that the cavity corresponds (e.g. in its dimensions) to the pre-molded package and/or the circuit board. The circuit board may be a PCB. A PCB mechanically supports and electrically connects electronic or electrical components using conductive tracks, pads and other features etched from one or more sheet layers of a conductive material e.g. copper laminated onto and/or between sheet layers of a non-conductive substrate, e.g. FR4. PCBs can be single-sided (one conductive layer), double-sided (two conductive layers on both sides of one substrate layer), or multi-layer (outer and inner layers of conductive material, alternating with layers of substrate). PCBs may be mass-produced and are highly customizable so that they represent very inexpensive and flexible circuit boards for use in the lighting device.

The lighting device according to the second aspect comprises a carrier according to the first aspect and at least one lighting module that is mounted along the arrangement direction of at least one of the mounting faces. The lighting module is in electrical contact to at least two contact sections, for example in that contact patches of the lighting module are in respective electrical contact to the contact sections. An electrical contact and/or mechanical connection may for instance be based on a soldered contact (e.g. by means of solder paste) and/or a contact with a conductive adhesive. The lighting module may be operated by applying a voltage to the conductors that are associated with the corresponding contact sections. For instance, the heat sink body portion may be configured to provide electrical contact to a power source so that the lighting module can be driven.

The heat sink body portion and the mounting portion of the carrier may be arranged to mimic the arrangement of a filament and the mounting in a traditional light source. For instance, the arrangement direction and the arrangement of the lighting module, or multiple lighting modules in particular correspond to the arrangement of a standard filament such as a halogen filament of an automotive head lamp.

When a sock-et is used, in particular the distance and orientation of the at least three mounting faces to the socket may correspond to the distance and orientation of a filament to a socket in a light source to be mimicked.

According to an exemplary embodiment of the invention, each of the at least three mounting faces comprises at least one mounting face contact section enabling electrical coupling between at least two of the at least three mounting faces.

Such a mounting face contact section enables to connect lighting module(s) mounted to the respective mounting face to the lighting module(s) of another mounting face in series.

According to an exemplary embodiment of the invention, the lighting device further comprises: at least three lighting module packages, wherein each of the at least three lighting module packages comprises multiple top contact chips, wherein each of the at least three lighting module packages is thermally coupled to each of the at least three mounting faces, and wherein each of the at least three mounting faces is electrically coupled in series via the contact section of each of the at least three mounting faces. For instance, via a wire bonding, a respective mounting face contact section of a first mounting face may be connected to another mounting face contact section of a second mounting face. Then, the respective mounting face comprises a second mounting face contact section which may be connected to another mounting face contact section of the third mounting face. For instance, in case of a ceramic substrate being mounting to the mounting portion and providing the at least three mounting face, each side of the ceramic tile are connected electrically to a neighbour via the respective mounting face contact section, e.g. by wire bonding or using a flex circuit board (e.g. a flex PCB).

According to an exemplary embodiment of the invention, each of the at least three mounting faces is configured for accommodating multiple lighting modules arranged along the arrangement direction. Multiple lighting modules may be in the form of a package comprising multiple lighting modules. Further, multiple lighting modules may be in the form of multiple lighting modules that are connected to each other in series, e.g. via the contact sections provided by a respective mounting face. In this way, multiple LED dies can be connected in series to a respective mounting face. This may provide an architecture in which top contact chips are connected together in series which are directly attached.

Such a top contact chip may be of a lateral chip, vertical chip or a CSP architecture. Such a top contact chip has a top contact pad for electrically coupling. Further, such a top contact chip is electrically isolated on its bottom side. Such a top contact chip may provide a simple chip architecture without requiring packaging of a single lighting module, in which epitaxial layers are disposed on top of sapphire and in which the current needed to drive the top contact chips is transported laterally between two electrodes. Electrical connection between several of such top contact chips can be done e.g. by wire-bonds situated on the top side. For instance, each of the top contact chips comprised by the respective lighting module package is connected with its neighbour top contact chip by a wire bonding. Such a top contact chip, or multiple top contact chips can be mounted (e.g. glued) directly on the carrier respectively heat sink (e.g. metal heat sink). All of the multiple top contact chips can be contacted together.

Such a top contact chip can easily be attached to a substrate, e.g. by gluing the bottom face of a respective top contact chip to the respective mounting face, wherein the bottom face is insulated from active layers situated on top side of sapphire. Advantageously, in particular using small top contact chips enables that they can fit easily in the light emitting area corresponding to the legal retrofit headlamp provided by the respective mounting faces. Electrical insulation of the heat sink body portion supporting the top contact chips is not needed in this case. Furthermore, for efficient heat transport, it is important that heat flow does not cross any thermal barrier between the location in which heat is generated and the heat sink body portion. For this purpose, mounting or attachment of the top contact chips on the respective mounting face is preferably done only with a thermal interface with a low thermal resistance. That means either the thickness of the thermal interface will be very small (thickness <10 μm) or the thermal conductivity of the thermal interface will be high (k>50 W/mK). A thermal interface of very low thickness is for example epoxy glue. A thermal interface with a high thermal conductivity is for example solder paste, glue filled with high content of silver or Ag sintering, to name but a few non-limiting examples. Using top contact chips enables that electrical insulation between the respective bottom face of the top contact chips and the heat sink body portion is not needed. Such top contact chips are therefore directly connected to the respective mounting faces of the carrier. The carrier can be made of a single part without any insulation barrier. This in particular reduces the complexity of the assembly process.

According to an exemplary embodiment of the invention, the at least one structure is formed by a ceramic substrate thermally coupled to the at least one mounting portion. The ceramic substrate is a monolithic ceramic tile. Such a ceramic substrate may not need electrical insulating material between the mounting faces. Further, mounting such a ceramic substrate to the mounting portion enables that no (e.g. additional) insulation is needed between the ceramic substrate and the heat sink body portion. The ceramic substrate is non-conductive. The ceramic substrate may have a rectangular cross-section. The at least three mounting faces are provided on three sides of the ceramic substrate, e.g. by a copper routing layer being arranged on the respective side of the ceramic substrate. The ceramic substrate may be an AlN (Aluminium Nitride) substrate.

According to an exemplary embodiment of the invention, the lighting device further comprises: at least one top routing layer; at least one bottom routing layer; and at least one third routing layer on a side of the ceramic substrate between the at least one top routing layer and the at least one bottom routing layer, wherein the at least one top routing layer, the at least one bottom routing layer, and the at least one third routing layer enable a connecting of multiple lighting modules in series. The routing layer(s) are provided on each respective mounting face of the at least three mounting face. Further, the respective routing layer(s) provide e.g. one or more contact sections so that lighting module(s) can be mounted to the contact section. The respective routing layer(s) may be made out of copper.

According to an exemplary embodiment of the invention, the method further comprises prior to the mounting of the at least one structure: providing a ceramic substrate (e.g. a wafer) comprising a top routing layer and a bottom routing layer, wherein the ceramic substrate comprises multiple small sections of ceramic tiles being separable from each other, wherein the multiple small sections of ceramic tiles are arranged in rows, columns, or a combination thereof; forming (e.g. cutting-out) a ceramic strip (e.g. such a strip being a row of multiple small sections of ceramic tiles) of the multiple small sections of ceramic tiles; depositing a third routing layer on a side between the top routing layer and the bottom routing layer to provide together three mounting faces; and forming a monolithic ceramic tile of the ceramic strip.

To manufacture such a ceramic substrate, e.g. the top routing layer and the bottom routing layer are formed, e.g. by patterning (e.g. printing, or chemical etching) such copper routing layers on both sides of a ceramic wafer. After this step, the large wafer with respective copper routing layer patterns on top and the bottom side is obtained. Preferably, the lighting module(s) or lighting module packages can be directly soldered on top and bottom copper routing layer. It is considered to be easier to attach in particular multiple lighting modules on the ceramic substrate when it is still in the wafer level. The ceramic substrate can be cut, e.g. into long strips. After this cut-out, several long strip (e.g. with a section of 0.8×0.8 mm corresponding to the filament to be mimicked) are obtained. Preferably, the AlN substrate can be etched in a way so that areas corresponding to the tile substrate are separated by small section areas. Further, e.g. by a mechanical cutting process or a laser cutting process the small section can be separated. The aforementioned manufacturing sequence enables to realize the assembly of multiple lighting modules on the wafer level which is more suitable for mass production of a plurality of lighting devices according to the second aspect. Each strip is collected and then the third side is patterned respective coated by a copper routing layer forming the third routing layer on the third mounting face. The third copper routing layer is preferably deposited by printing it on the mounting face. It will be understood that other deposition methods of any of the routing layers is also possible. Finally, one or more lighting modules (e.g. LEDs) are attached to the third copper routing layer. As a next step, the ceramic strips can be sectioned at several positions in order to obtain the length corresponding to the ceramic tile which will be used in the automotive headlamp to be mimicked.

According to an exemplary embodiment of the invention, the multiple lighting modules are soldered to the at least one top routing layer, the at least one bottom routing layer, and the at least one third routing layer. The soldering may be done by a soldering paste.

According to an exemplary embodiment of the invention, the lighting device further comprises: at least one pre-molded package or at least one circuit board electrically coupling a first lighting module and a last lighting module of the multiple lighting modules, or of the at least three lighting module packages in case the lighting modules are packaged, with a connector to drive the at least three lighting module packages.

According to an exemplary embodiment of the invention, the at least one pre-molded package or the at least one circuit board is configured to be coupled with the first lighting module and the last lighting module of the multiple lighting modules, or of the at least three lighting module packages, with a lead frame.

The pre-molded package may be inserted into the cavity of the carrier. The pre-molded package may comprise a lead frame, the pre-molded package may comprise on each of its ends two lead frame. For instance, on the mounting portion, there are arranged on each of the at least three mounting face multiple lighting modules. The pre-molded may be inserted into a cavity so that electrical coupling between a first lighting module of a first mounting face of the at least three mounting face and a last lighting module of a third mounting face of the at least three mounting face to the pre-molded package is enable. Therefore, the pre-molded package may comprise on opposite sides contact section that may be electrically coupled e.g. via wire-bonding to the first and last lighting module (e.g. top contact chips, in particular lateral chips). The cavity in the carrier may have at least two openings on two opposite sides of the triangular cross section. Multiple lighting modules mounted to each of the at least three mounting faces can be connected in series, since a first mounting face is connected to the second mounting face via the respective mounting face contact sections (and e.g. wire-bonding), the second mounting face is connected to a third second mounting face via the respective mounting face contact sections (and e.g. wire-bonding). This enables that the first lighting module of the multiple lighting modules mounted on the at least three mounting face is on the first mounting face being opposite to the third mounting face to which the last lighting module is mounted. The pre-molded package may comprise another contact section in the form of a connector to be electrically coupled to the two lead frames so that via this other contact section the lighting modules can be connected to a driver. Such a pre-molded package or such a circuit board can be used to electrically couple a first lighting module and a last lighting module of multiple lighting modules to it. The multiple lighting modules are e.g. mounted to the three mounting faces. The pre-molded package or the circuit board can be used in case a structure is formed by a ceramic substrate which is mounted to the mounting portion of the carrier, wherein the multiple lighting modules are coupled to the ceramic substrate. Additionally or alternative, the pre-molded package or the circuit board can be used in case a structure comprising the three mounting faces for mounting of the multiple top contact chips is used, wherein the structure is integrally formed with the carrier respectively the mounting portion having a triangular cross section. In the latter case, the carrier comprising the structure on its mounting portion can be formed in one-piece.

According to an exemplary embodiment of the invention, the method further comprises: arranging a pre-molded package or a circuit board to the carrier, wherein the pre-molded package comprises a lead frame; and mounting the pre-molded package or the circuit board to the carrier. The pre-molded package may be arranged to the carrier by sliding the pre-molded package into the corresponding cavity of the carrier. Further, the pre-molded package may comprise elements for fixating the pre-molded package to the carrier. Additionally or alternatively, the pre-molded package can be fixated to the carrier by gluing or soldering it to the carrier, to name but a few non-limiting examples.

According to an exemplary embodiment of the invention, the method further comprises: arranging the pre-molded package or the circuit board in at least one cavity of the carrier, and electrically coupling a first lighting module and a last lighting module of the three lighting module packages with the pre-molded package or the circuit board. The pre-molded package or the circuit board may comprise at least one lead frame enabling a contact section for an electrical coupling to a driver.

In order to fulfil the near field requirement of a halogen bulb, lighting module(s) in the form of top contact chips (e.g. lateral chips) may be disposed to manufacture a respective lighting device on the at least three mounting face of the carrier. The top contact chips are then connected together via wire-bonds, as disclosed above. Each "side" of top contact chips is electrically connected to the other row e.g. via wire-bonds, wire or flex PCB and via the top contact mounting face contact section provided on the respective mounting faces. The top contact can be disposed in a small cavity formed by the respective mounting face. Finally, phosphor converter is dispensed on top of the top contact chips so that the cavity is filled. By such a combining of e.g. top contact blue chips with dispensed phosphor, insulation between the heat sink body portion and the lighting module(s) is enabled. For instance, LED tracks and/or LED substrates are not needed. In this way, the retrofit headlamp assembly process and the manufacturing costs can be considerably reduced. Furthermore, a method to easily connect the top contact chips in series (e.g. a chain) is enabled.

With the method according to the third aspect, the lighting module is brought into electrical contact to the contact sections provided on each of the at least three mounting face, for example in that contact patches of the lighting element are electrically connected to the respective contact section(s). The electrical contact may for example be established by means of soldering, in particular by using solder paste, and/or by using conductive adhesive.

In case CSP packages without side coating but with a phosphor converter are to be mounted, such CSP packages can be directly mounted (e.g. soldered) on top of the respective routing layer. Preferably, each side of the ceramic substrate (e.g. ceramic tile) is populated with multiple lighting modules (e.g. LEDs) which are connected in serial via the contact sections of the respective routing layer(s). Cable, wire or flex circuit boards (e.g. PCB (printed circuit board)) can also be used to electrically connect a last contact section (e.g. in the form of an electrical pad) of a respective mounting face to a first contact section of another mounting face. In this way, multiple lighting module mounted to the at least three mounting faces that are situated on each ceramic "side" can be connected together electrically with wire, wire bond or flex PCBs, and in series.

According to an exemplary embodiment of the invention, the at least one structure is formed integrally with the at least one at least one mounting portion, wherein the at least one structure provides three mounting faces for receiving of at least one lighting module; and the method further comprises: mounting a respective lighting module packages comprising multiple top contact chips on each of the three mounting faces; and electrically connecting the multiple top contact chips of each of the lighting module packages in series (e.g. via wire-bonding). This example embodiment is suitable when as multiple lighting modules, multiple top contact chips are used, as disclosed above.

The carrier and/or the lighting device according to example embodiments of the invention may in particular be configured for a use in automotive lighting, e.g. as automotive head light.

The features and example embodiments of the invention described above may equally pertain to the different aspects according to the present invention. In particular, with the disclosure of features relating to the carrier and the lighting device according to the first and second aspect, also corresponding features relating to the method according to the third aspect are disclosed.

It is to be understood that the presentation of embodiments of the invention in this region is merely exemplary and non-limiting.

Other features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not drawn to scale and that they are merely intended to conceptually illustrate the structures and procedures described herein.

BRIEF DESCRIPTION OF THE DRAWING(S)

Examples of the invention will now be described in detail with reference to the accompanying drawing, in which.

Figure 5:
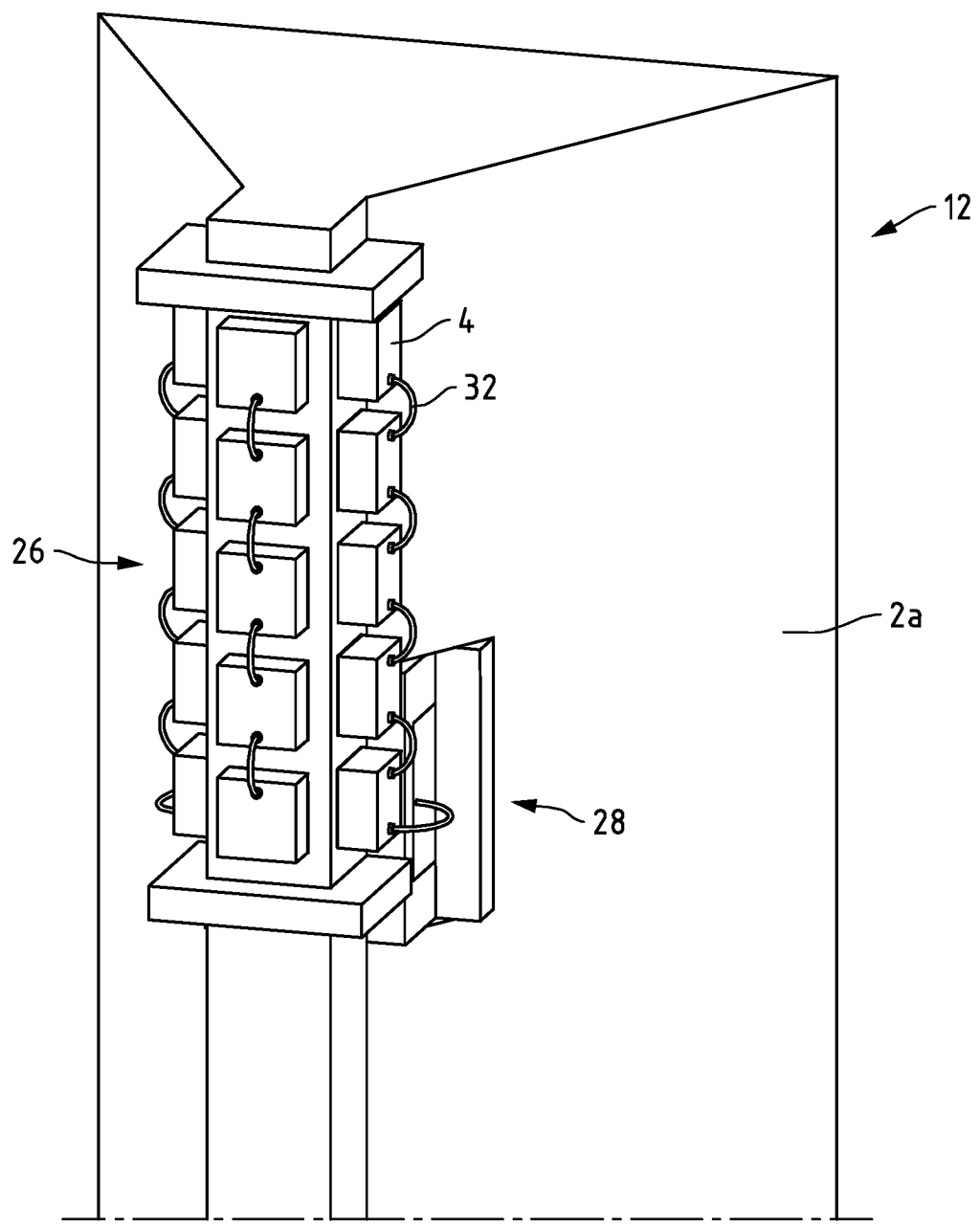
Figure 6A:
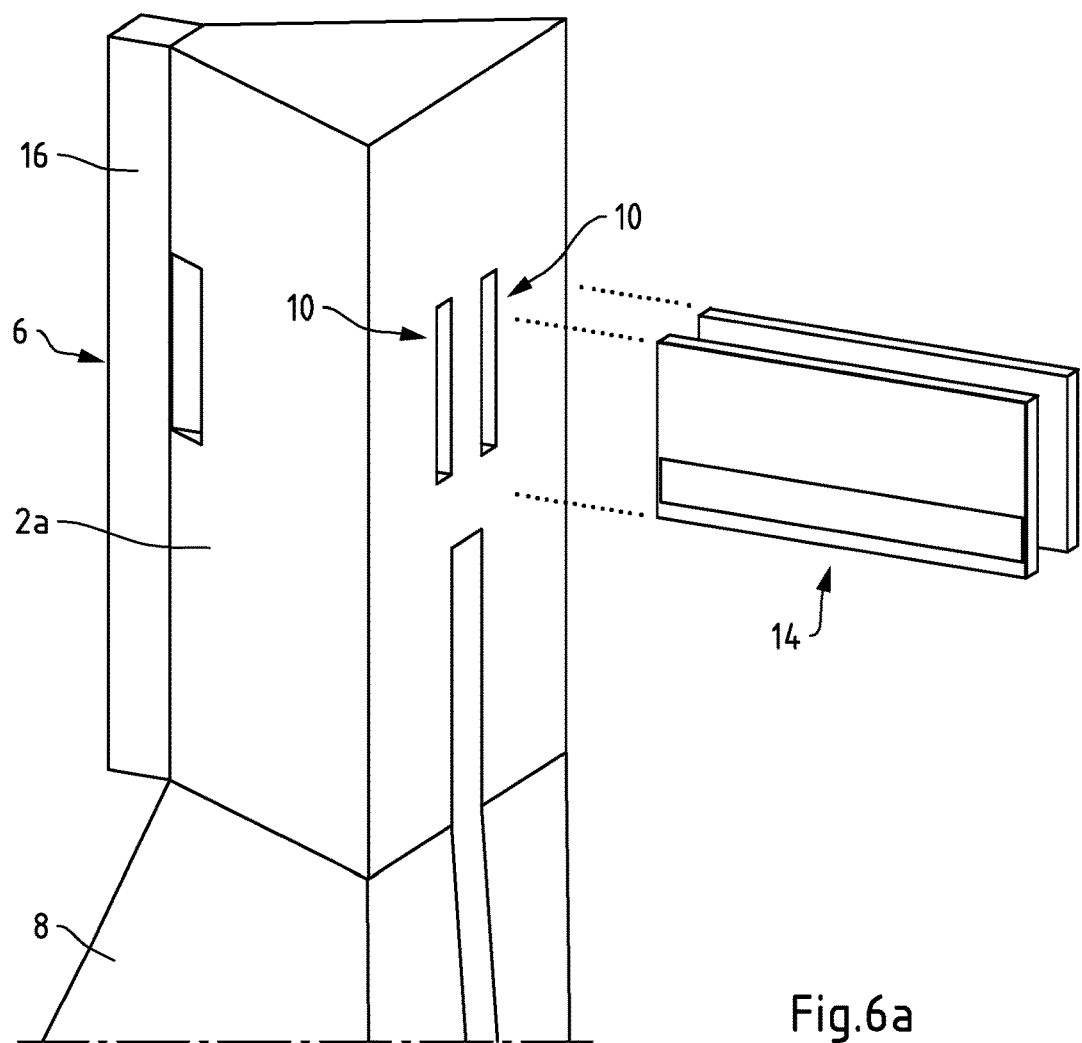
Figure 8A:
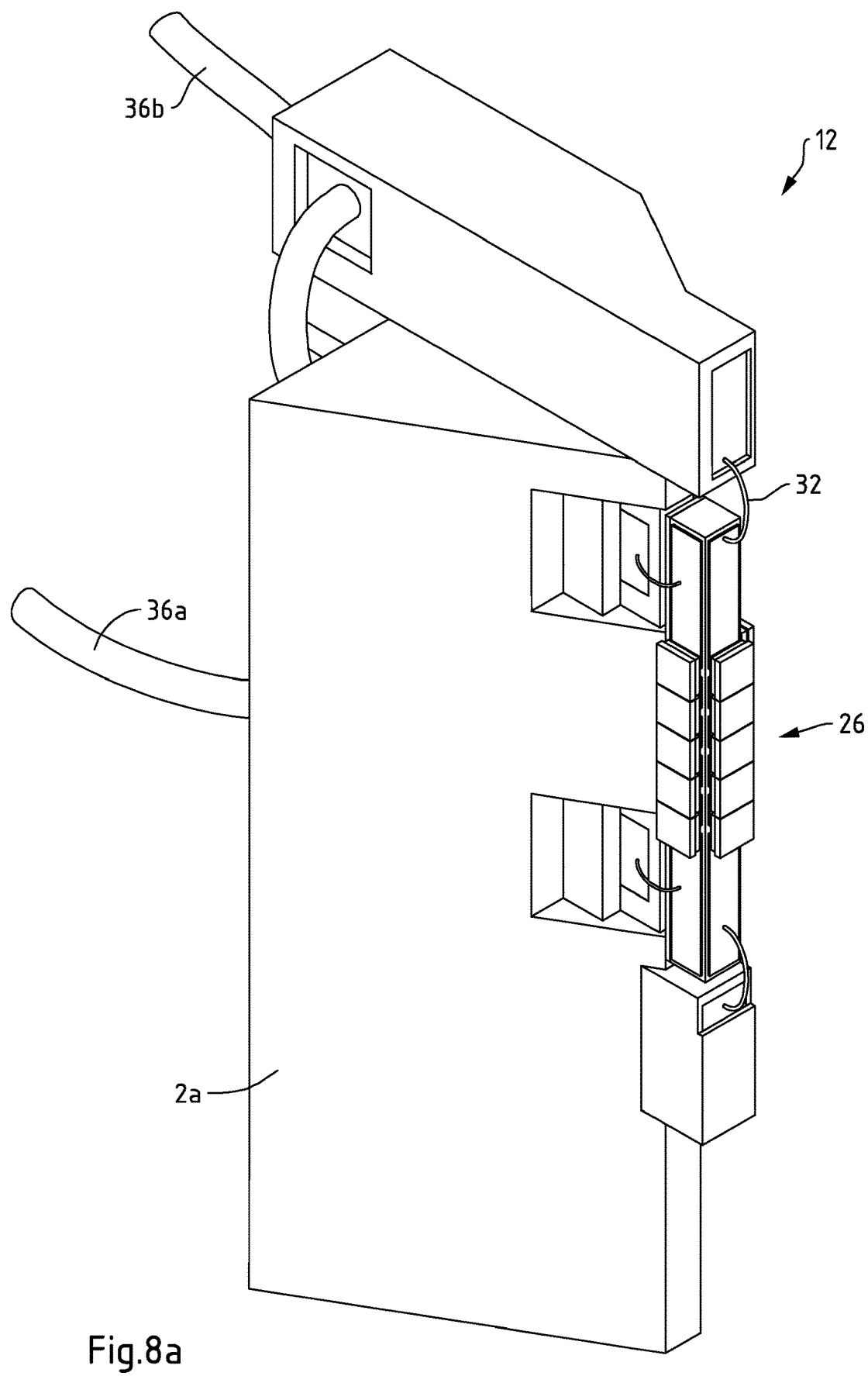
Figure 8B:
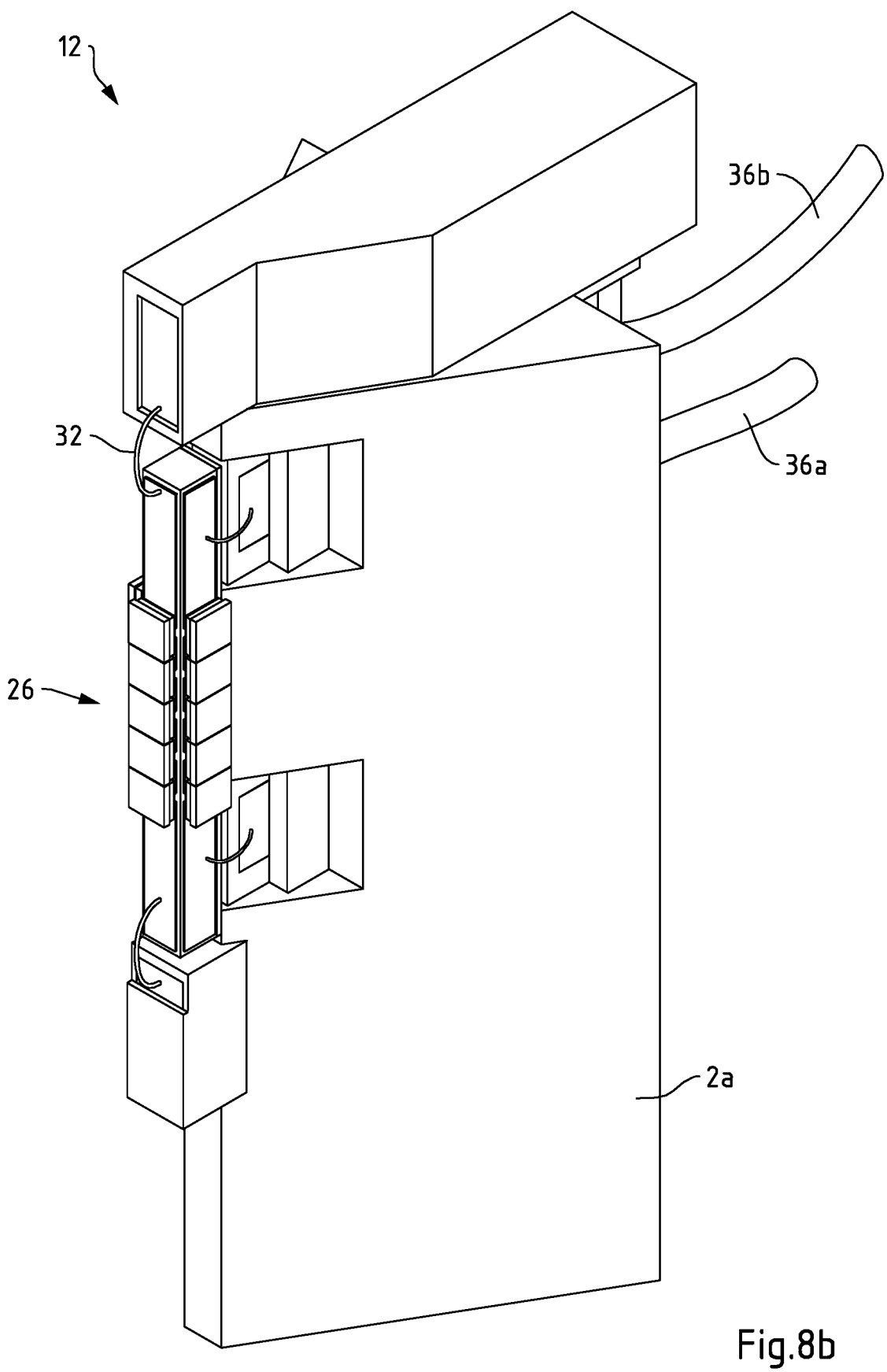
Figure 8C:
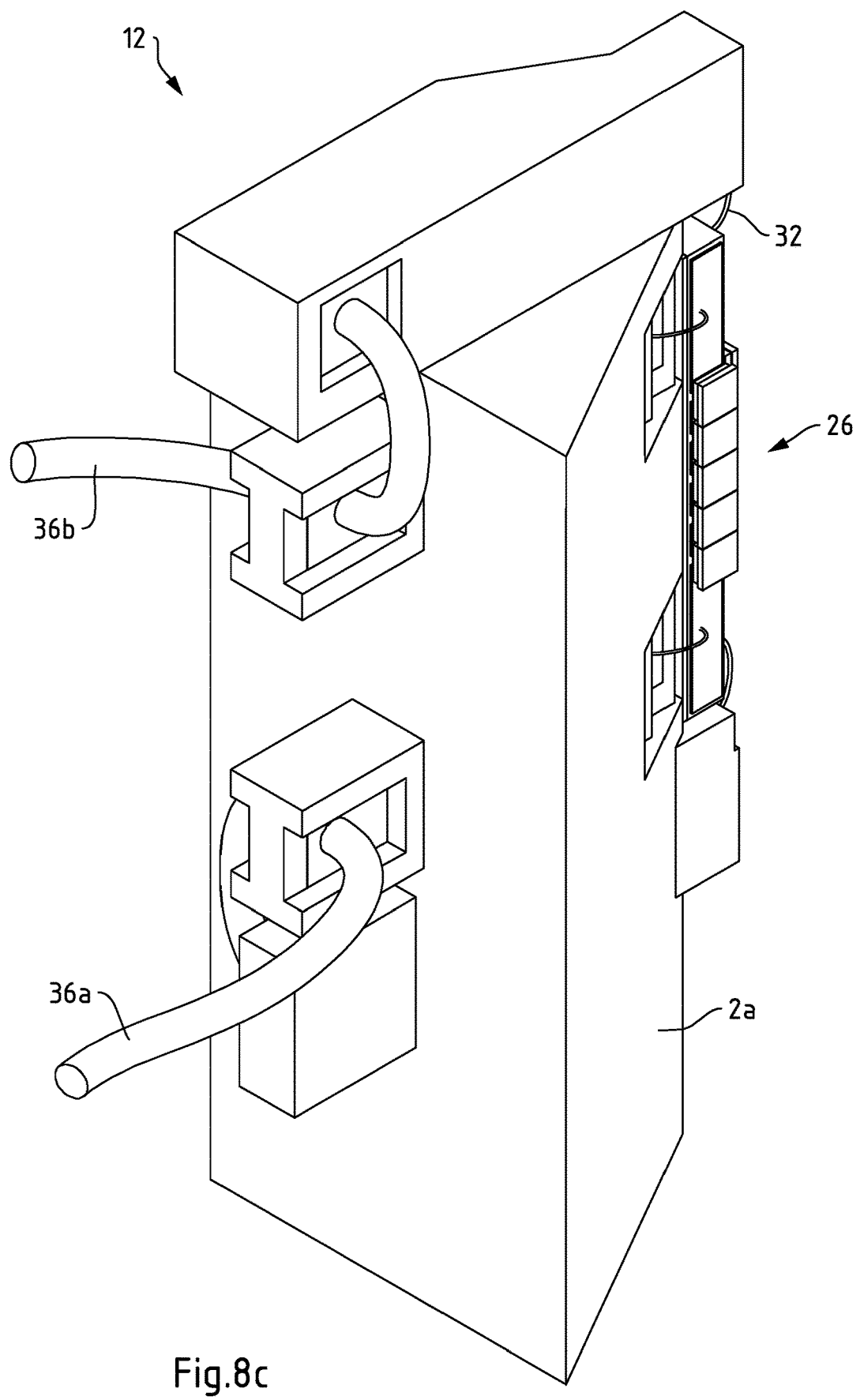
Figure 9:
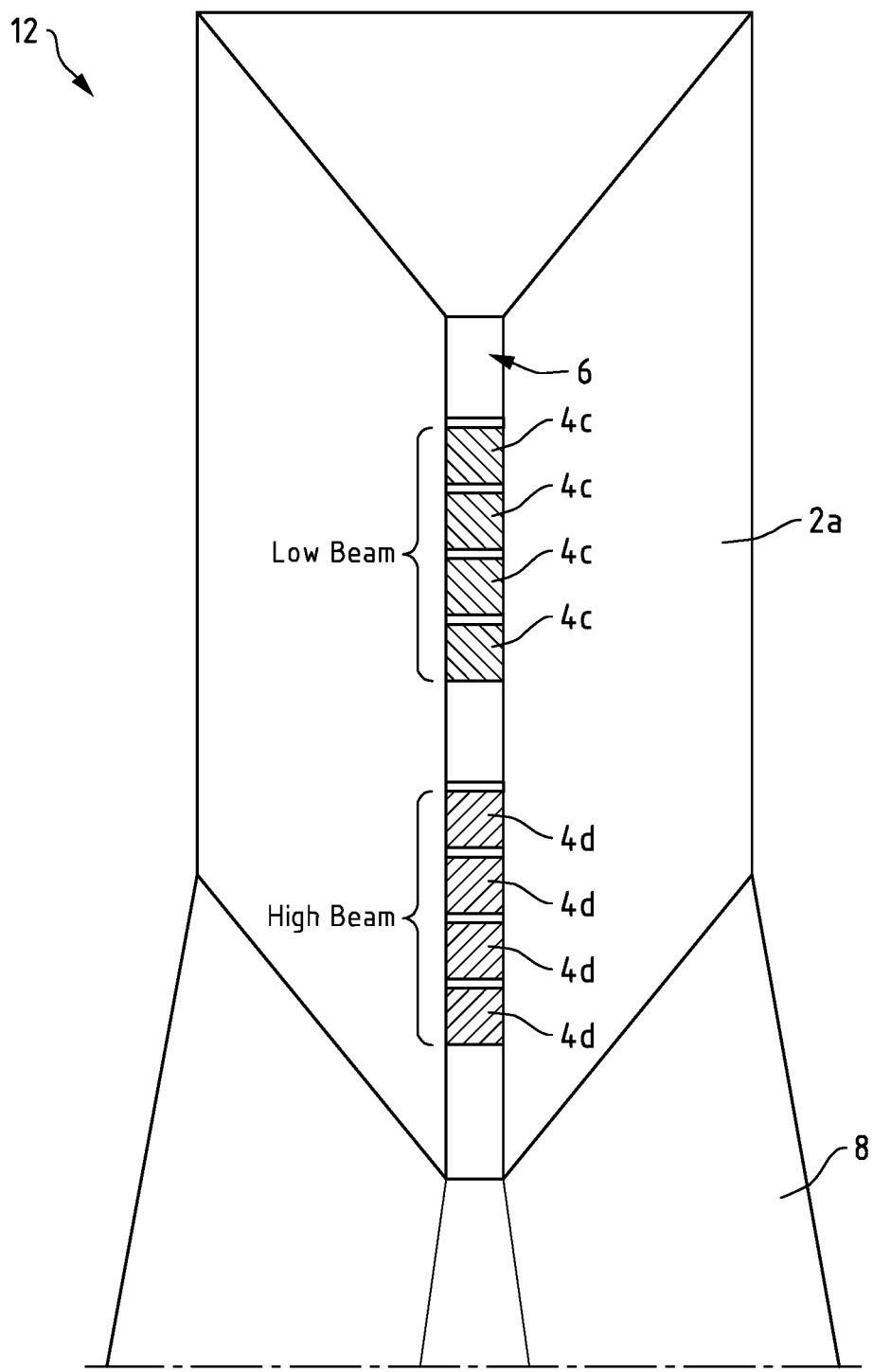

FIG. 4a-h show schematic representations of steps of a method to manufacture a lighting device of a second embodiment in perspective views;

FIG. 5 shows a schematic representation of another embodiment of a lighting device of the second aspect in a perspective view;

FIG. 6a, b shows schematic representations of details of the lighting device of FIG. 5;

FIG. 7a-g show schematic representations of steps of a method to manufacture a lighting device of a second embodiment in perspective views;

FIG. 8a-c show a schematic representation of another embodiment of a lighting device of the second aspect in different perspective views; and FIG. 9 shows a schematic representation of another embodiment of a lighting device of the second aspect in a front view.

DETAILED DESCRIPTION OF THE PREFERRED EMBODIMENT(S)

Figure 1A:
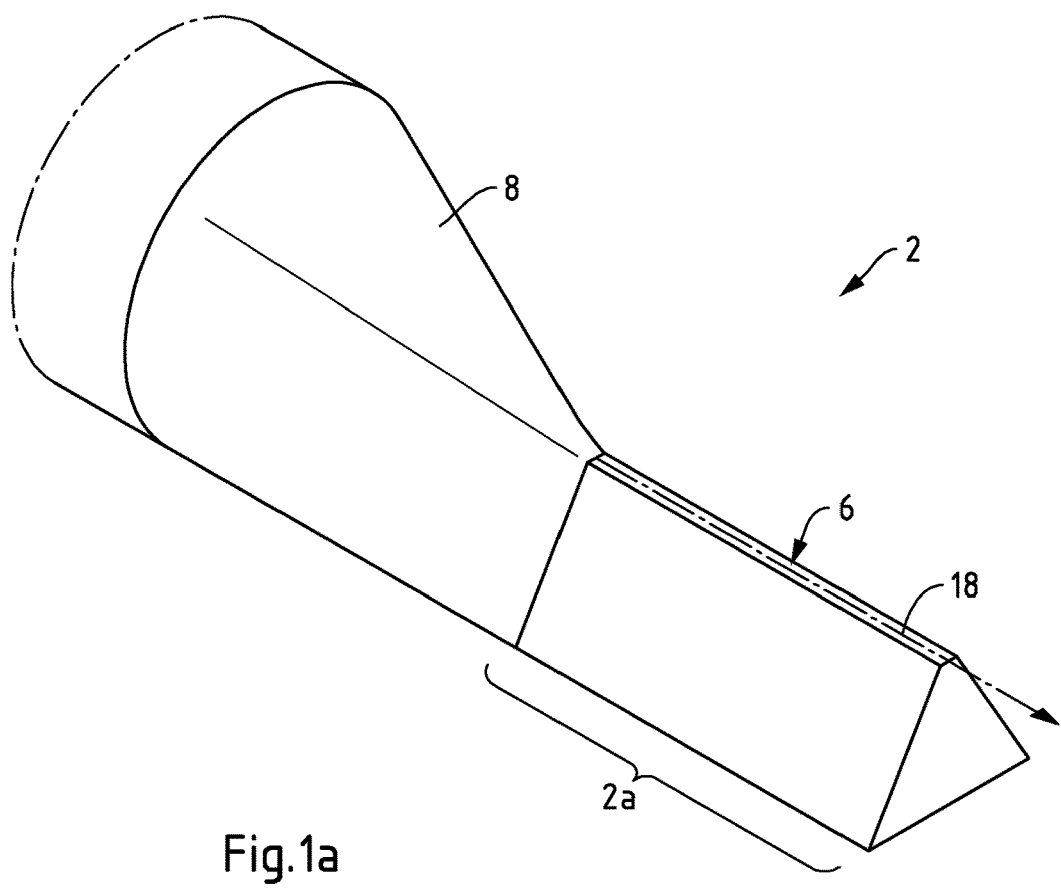
FIG. 1a shows a schematic representation of an embodiment of a carrier of the first aspect in a perspective view.

FIG. 1a shows a schematic representation of a first embodiment of a carrier in a perspective view. The carrier 2 is formed from two parts: the heat sink body portion 8 and the mounting portion 6, which is provided at present on the top of the nose 2a. The nose 2a and the heat sink body portion 8 are thermally coupled to each other. The nose 2a is in a v-shaped form, thus comprises a triangular cross section. The mounting portion 6 has an arrangement direction 18. One or more lighting modules 4 can be arranged along the arrangement direction 18, in particular on a structure 16 which comprises the one or more lighting modules 4 and which is thermally coupled to the mounting portion 6.

Figure 1B:
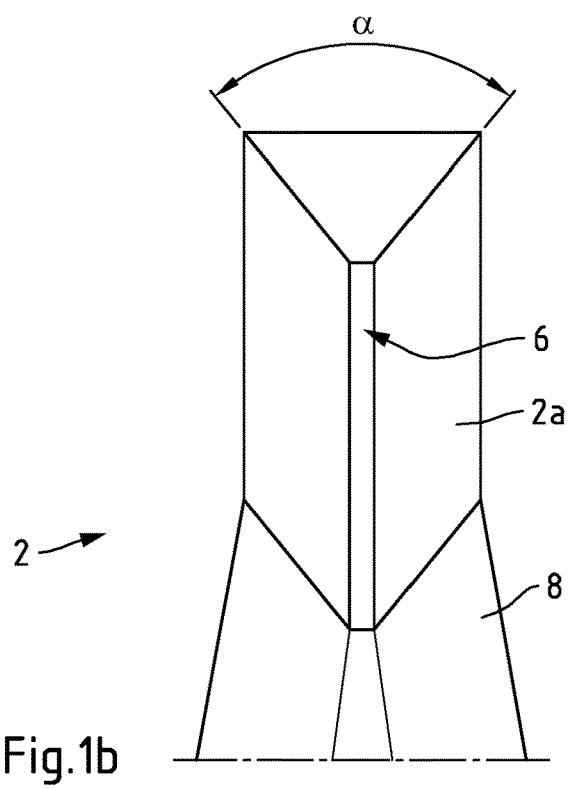
FIG. 1b shows the schematic representation of FIG. 1a of the embodiment of the carrier in a front view.

FIG. 1b shows the schematic representation of FIG. 1a in a front view. It can be seen that the nose 2a comprising the mounting portion 6 shadows emitted light from the one or more lighting modules 4 over an angle α, wherein α may be a 58° angular range due to the v-shaped form of the carrier 2 in the part of the nose 2a. The nose 2a is a truncated nose shadowing a limited angular range.

Figure 2A:
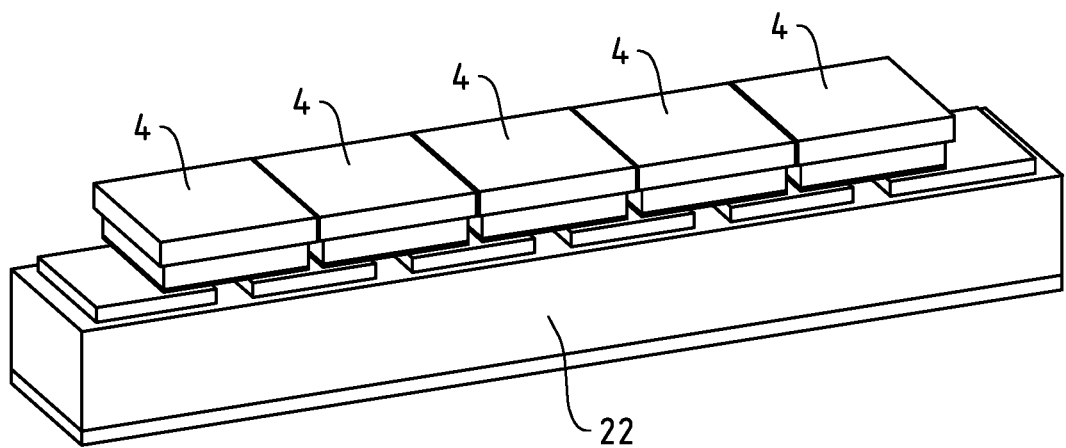
FIG. 2a shows a schematic representation of a structure to be mounted to a lighting device of the second aspect in a perspective view.

FIG. 2a shows a schematic representation of a structure to be mounted to a lighting device 12 of the second embodiment in a perspective view. The ceramic substrate 22 is for instance a ceramic DBC (Direct bonded copper) substrate. The copper is represented by a routing layer attached to the ceramic substrate 22. The routing layer is divided into several contact sections enabling one or more lighting modules 4 to be mounted to the ceramic substrate 22. In FIG. 4, the routing layer 24a on the top side is divided into five contact sections so that each of the shown four lighting modules 4 is connected to two neighbouring contact sections. The lighting modules 4 are connected in series via the contact sections.

Figure 2B:
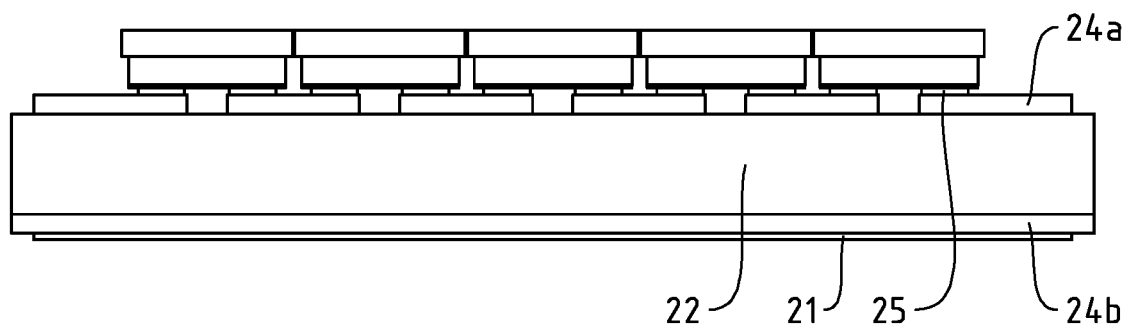
FIG. 2b shows the schematic representation of FIG. 2a in a side view.

FIG. 2b shows the schematic representation of FIG. 2a in a side view. The ceramic substrate 22 comprises a top routing layer 24a on its top, and further comprises another bottom routing layer 24b on its bottom. Both routing layers 24a and 24b are made of copper, in particular it is copper bonded to the ceramic substrate 22. The ceramic substrate 22 comprises a thermal interface 21 that is thermally conductive, e.g. to be thermally coupled to the mounting portion 6 of the carrier 2. It will be understood that in the embodiment shown in FIG. 2b lighting modules are not to be attached to the bottom routing layer 24b. In case of using such a ceramic substrate 22 to provide three mounting faces 6a, 6b and 6c, the ceramic substrate 22 needs to comprise at least three routing layers providing one or more contact sections to be attached with one or more lighting modules 4.

Figure 3:
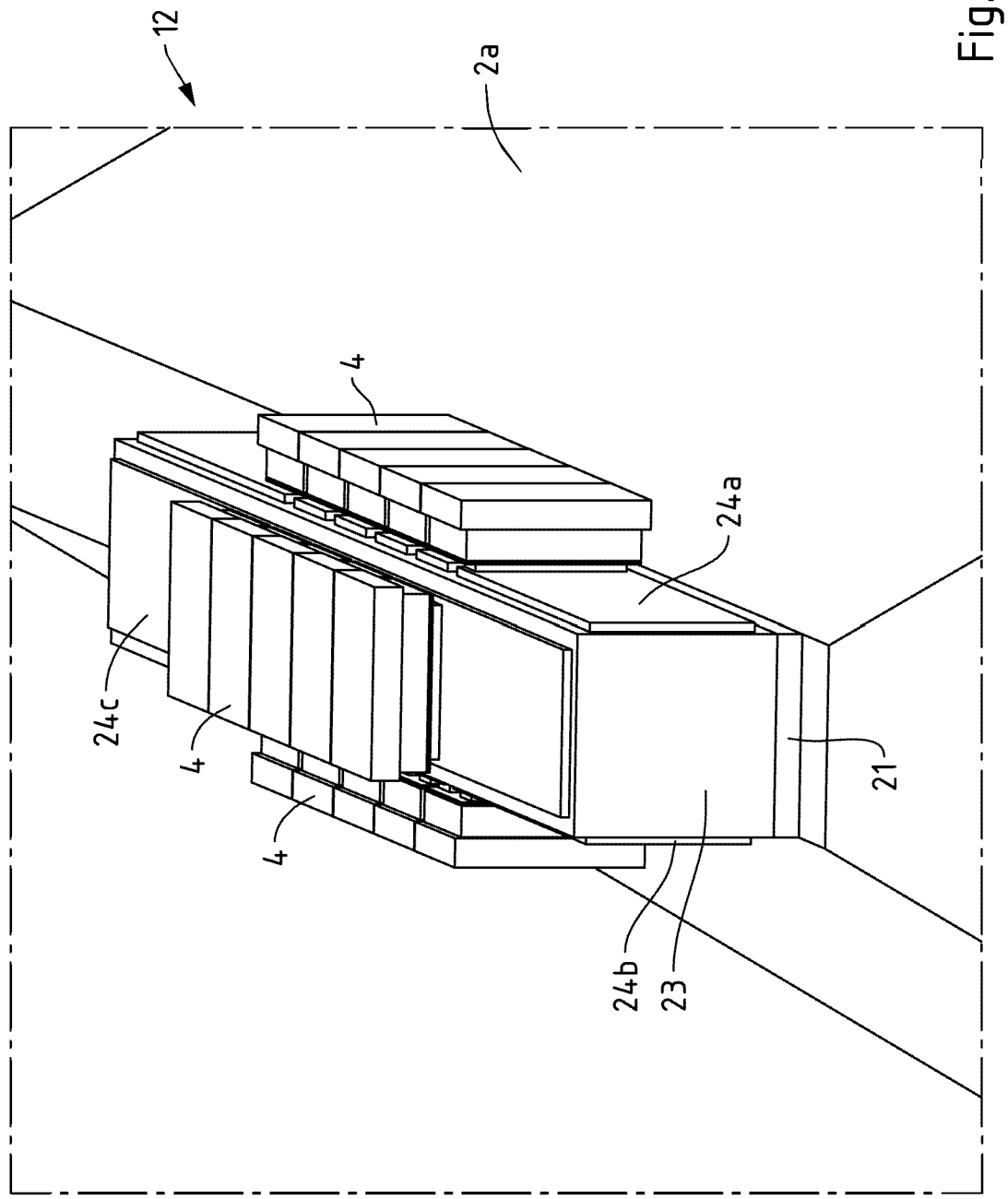
FIG. 3 shows a schematic representation of an embodiment of a lighting device of the second aspect in a perspective view.

FIG. 3 shows a schematic representation of a second embodiment of a lighting device in a perspective view. It is shown a ceramic tile 23 as a base element of a structure 16 that is mounted to the mounting portion 6 of the v-shaped carrier 2 respectively its nose 2a. The ceramic tile 23 comprises a thermal interface 21 that is electrically conductive and mounted to the nose 2a. Further, the ceramic tile 23 comprises three routing layers 24a, 24b and 24c on each of its sides provided three mounting faces 6a, 6b and 6c. On each of the mounting faces 6a, 6b and 6c at present five lighting modules 4 are mounted, wherein the lighting modules 4 are arranged on the respective mounting faces 6a, 6b and 6c along the arrangement direction 18 (see FIG. 1a). The lighting modules 4 are connected in series on each of the mounting faces 6a, 6b and 6c, and further, the lighting modules of each of the mounting faces 6a, 6b and 6c are also connected in series to each other. The ceramic tile 23 is a monolithic ceramic tile. To get the proper radiation characteristic, the lighting modules 4 are disposed and connected electrically on the ceramic monolithic tile 23.

A legal H11 LED retrofit assembly may include a connector to mount a lamp in a head lamp, a connector socket to connect the cable, electric cable connected to a first and last electrical contact section comprising lighting modules 4 of the ceramic substrate 22 and, if needed, active cooling (e.g. a fan) to cool the back side of the heat sink body portion 8.

FIG. 4a-h show schematic representations of steps of a method to manufacture a lighting device of a second embodiment in perspective views. It is shown a process assembly of a three-sided ceramic nose arrangement as a structure 16 to be mounted to a carrier 2 comprising a mounting portion 6 and a heat sink body portion 8.

Figure 4A:
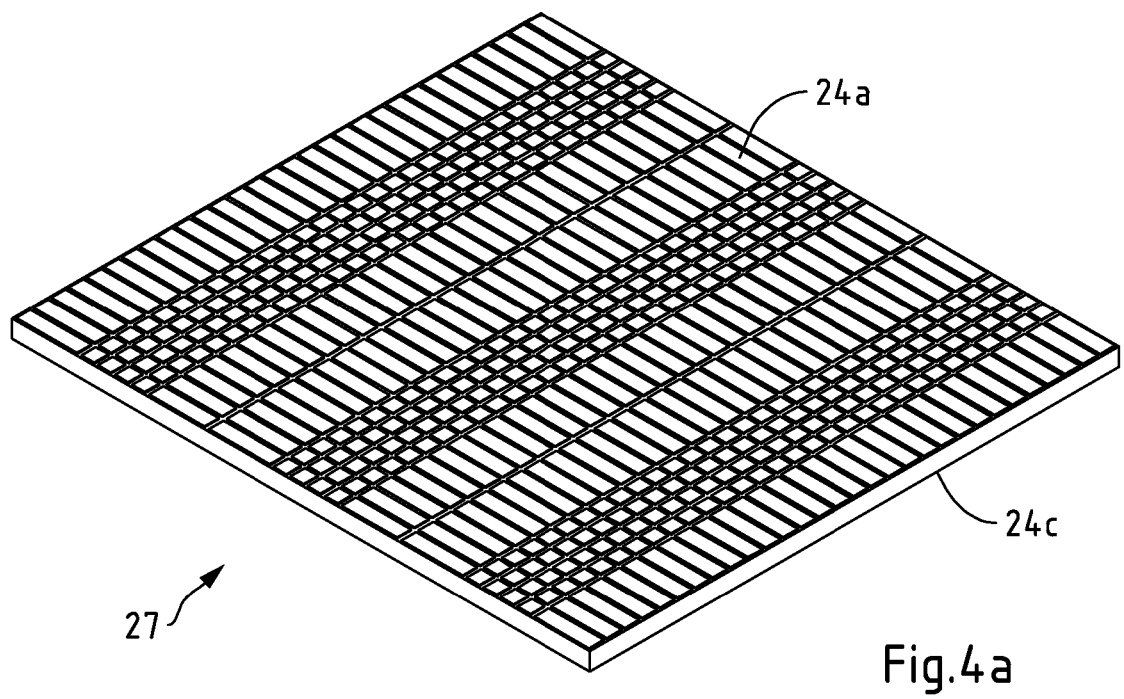

In a first step shown in FIG. 4a, a ceramic substrate in the form of a wafer 27 comprises patterned copper routing layers 24a, 24b on top and bottom side. The copper patterning can be done by a direct bonding process.

Figure 4B:
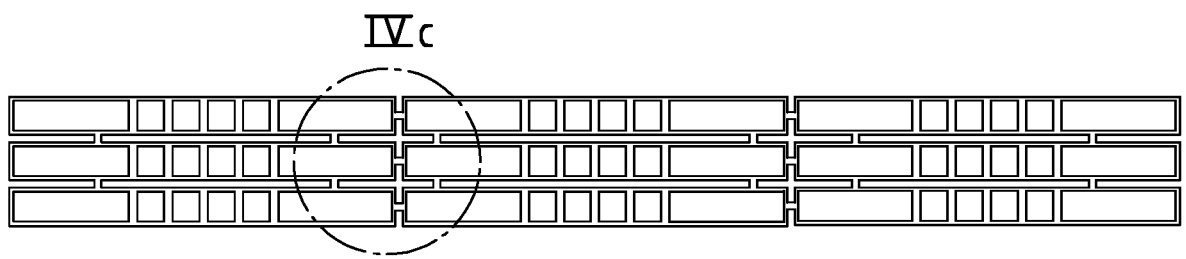
Figure 4C:
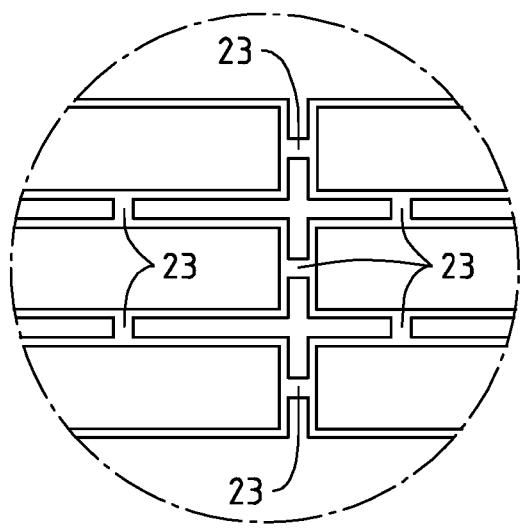

FIG. 4b shows an embodiment of the wafer 27 in which strips are separated by small sections of ceramic, wherein the small sections connect the strips with each other. This is shown in detail in FIG. 4a (iii).

Figure 4D:
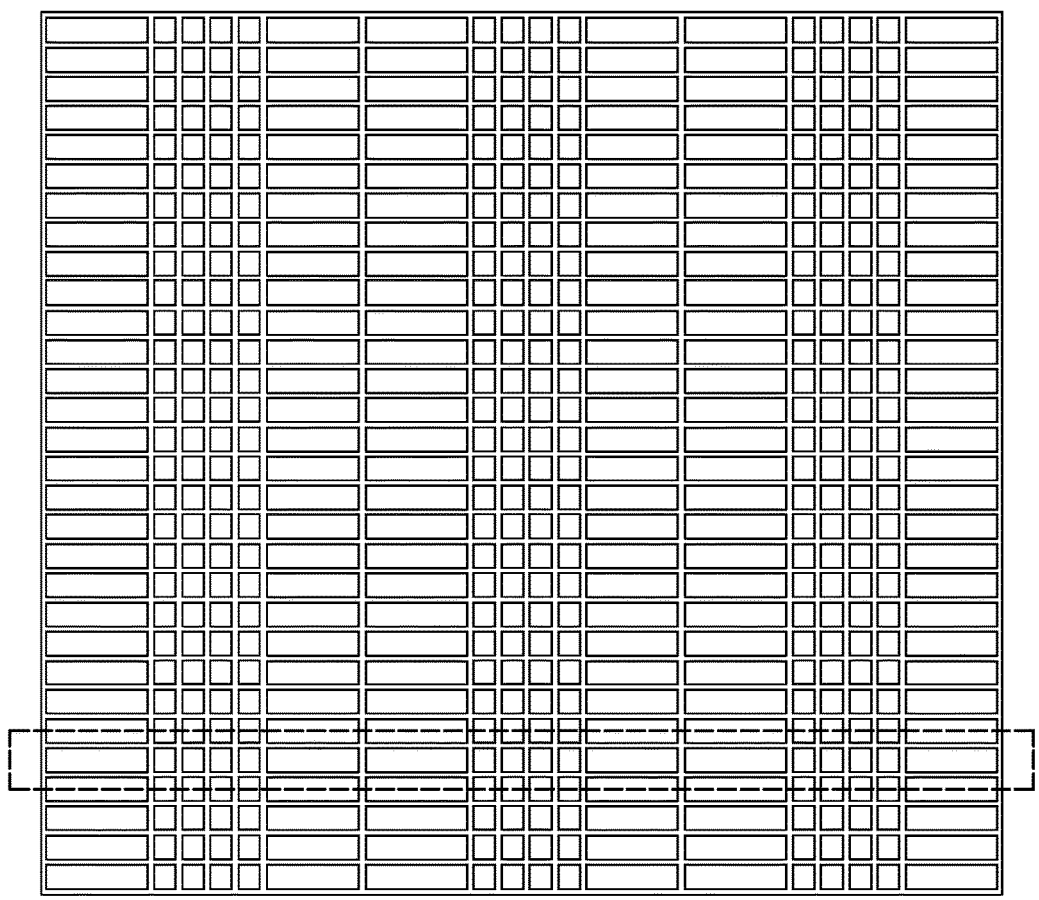
Figure 4E:
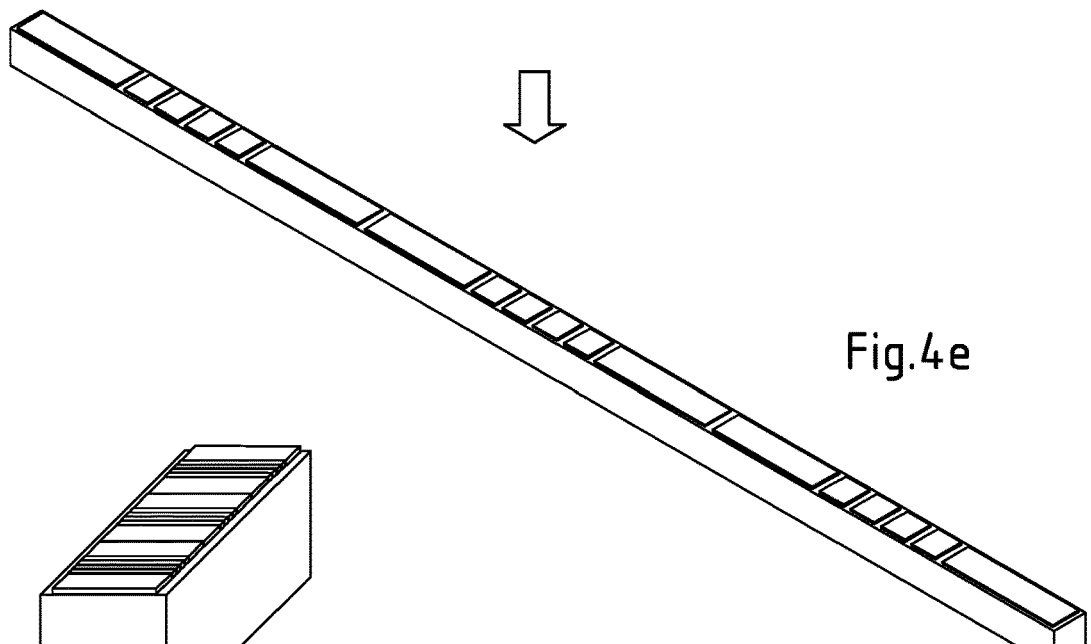
Figure 4F:
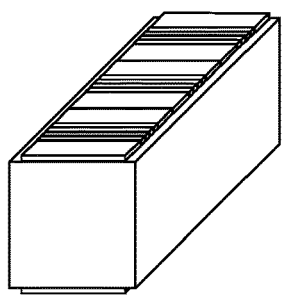

In a second step shown in FIG. 4d to FIG. 4f, a cut-out of ceramic strip with the top and bottom routing layers 24a, 24b is shown. Large ceramic substrate in the form of the wafer 27 (shown in FIG. 4d) is cut-out into a single ceramic patterned strip (shown in FIG. 4e and FIG. 4f).

In a third step shown in FIG. 4h, a deposition of another copper routing layer as the third routing layer 24c is done. The single ceramic patterned strip (shown in FIG. 4g) is used to pattern the third mounting face 6c with a copper routing, e.g. by printing the third routing layer 24c on the respective side of the strip. In this way, a ceramic substrate with copper routing layers on three sides can be achieved. It will be understood that other assembly chains are possible, but the shown assembly sequence is in particular suitable for a mass production.

FIG. 5 shows a schematic representation of a second embodiment of a lighting device in a perspective view. The carrier 2 comprises a structure 16 mounted on the v-shaped part, at present the nose 2a. The structure 16 provides the three mounting faces 6a, 6b and 6c, wherein each of the three mounting faces 6a, 6b and 6c comprises multiple lighting modules 4 in the form of lighting module packages 26. The lighting modules 4 are top contact chips, at present lateral chips that are directly mounted to a respective mounting face of the three mounting faces 6a, 6b and 6c. The lighting modules 4 are connected to each other in series, at present with wire-bonds 32, wherein a respective wire-bond 32 connects two neighboring lateral chips. Further, the carrier comprises a pre-molded package 28 at is inserted into a cavity 10 of the carrier 2. The pre-molded package 28 provides electrical contact for a first lighting module 4a (shown on the right mounting face), and for a last lighting module 4b being located on the mounting face opposite to the shown right mounting face.

For instance, the top contact chips are blue lateral chips which are not phosphor and therefore a phosphor 34 (see FIG. 7g) converter is needed on top to obtain an intended color point. Moreover, the bottom side of such top contact chips is electrically insulated which means that top contact chips can be easily connected to a substrate with an electrically insulated thermal interface.

The nose arrangement of FIG. 5 in which top contact chips are connected electrically, are disposed directly on a monolithic carrier 2 comprising the heat sink body portion 8. As it could be seen, such a nose arrangement is much simpler than the known arrangements as in particular no electrical insulation is needed between the heat-sink bodies providing the mounting faces for supporting the top contact chips. Thermal performances are also much better than known nose arrangement as the heat-sink body portion is not needed to be insulated.

Figure 6B:
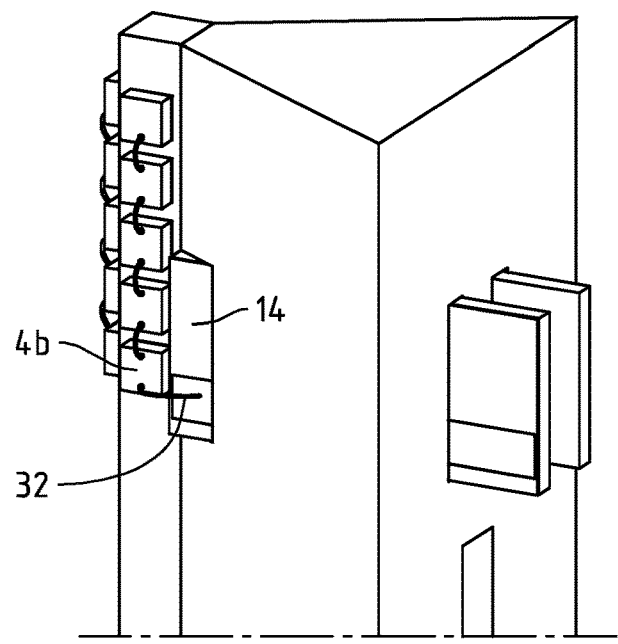

FIG. 6a and FIG. 6b show schematic representations of details of the lighting device of FIG. 5. To connect the first and last top contact chip 4a and 4b, a pre-assembly made of a lead frame providing contact sections for the first and last top contact chips 4a and 4b overmolded with a hard plastic compound and e.g. four or more open contact areas will be used. One of the contact areas is a connector 30 to be connected to a power source to drive the top contact chips. The pre-molded package 28 is inserted and fixed e.g. by fitting it in a cavity 10 of the carrier 2. As a low cost alternative, the pre-molded package 28 can be replaced by a PCB 14. One advantage of using a PCB 14 or a pre-molded package 28 is that the wire-bonding on a contact section (e.g. a metal pad) of the first and last top contact chips 4a, 4b is done on the same vertical level as the wire-bonding 32 between two neighbouring top contact chips so that a robust wire interconnection is provided. On the right hand side of FIG. 6, it is shown that a PCB 14 is inserted into the cavity 10 shown on the left hand side of FIG. 6, and that a wire-bonding 32 of the first top contact chip 4a is done to a contact section provided by the PCB 14.

FIG. 7a-g respectively show a process assembly in sequence to manufacture a lighting device according to the second aspect that comprises a plurality of top contact chips on a three-side structure (e.g. a heat sink nose).

Figure 7A:
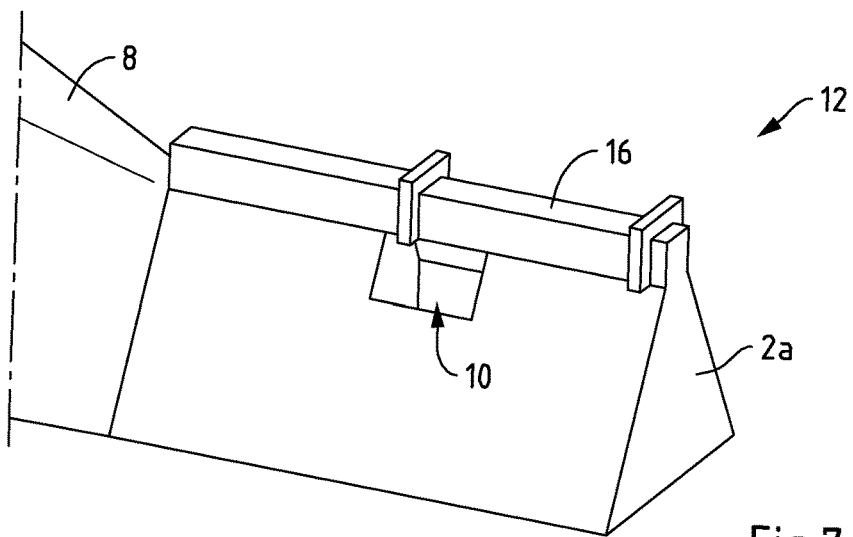

In a first step shown in FIG. 7a, the shaped heat-sink nose 2a including three mounting faces 6a, 6b and 6c provided by the mounting portion 16 to receive one or more top contact chips 4 is formed integrally with the heat sink body portion 8. Further, the nose 2a comprises a cavity 10 for receiving of a pre-molded package 28, to name but one non-limiting example. Further, the mounting portion 16 comprises on its end small walls defining space for a phosphor converter to be dispended. Such a carrier 2 is produced. Such a carrier 2 may be produced by die casting or milling, to name but a few non-limiting examples.

Figure 7B:
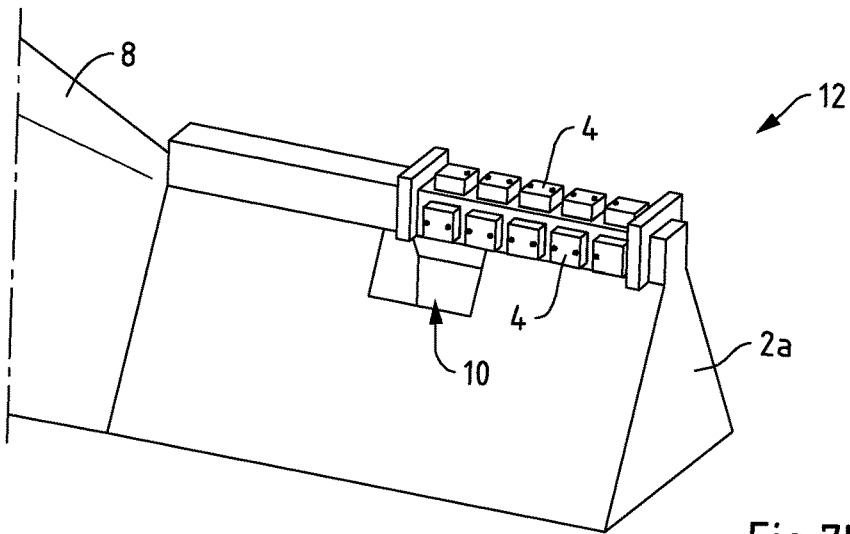

In a second step shown in FIG. 7b, the top contact chips as lighting modules 4 are attached on the mounting faces 6a, 6b and 6c, which are made of copper. Preferably, the top contact chips are attached on the respective mounting faces 6a, 6b and 6c by gluing. The glue thickness is advantageously less than 10 μm.

Figure 7C:
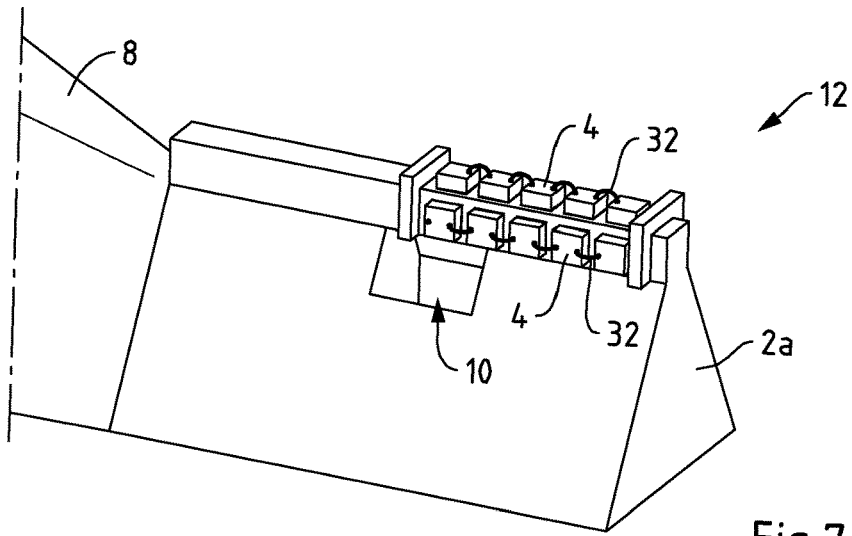

In a third step shown in FIG. 7c, the connection between each top contact chip of the plurality of top contact chips of a given side of the three mounting faces 6a, 6b and 6c is done, e.g. by wire-bonds 32 or wire-bonding.

Figure 7D:
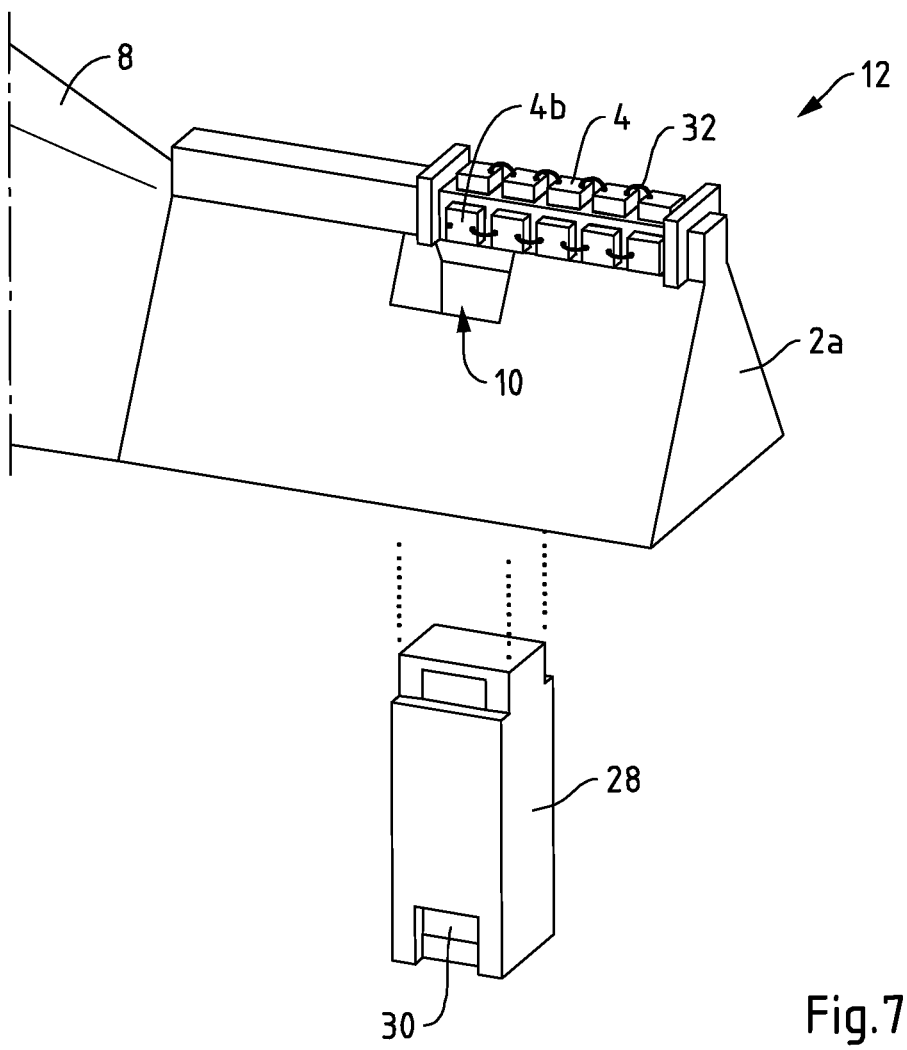
Figure 7E:
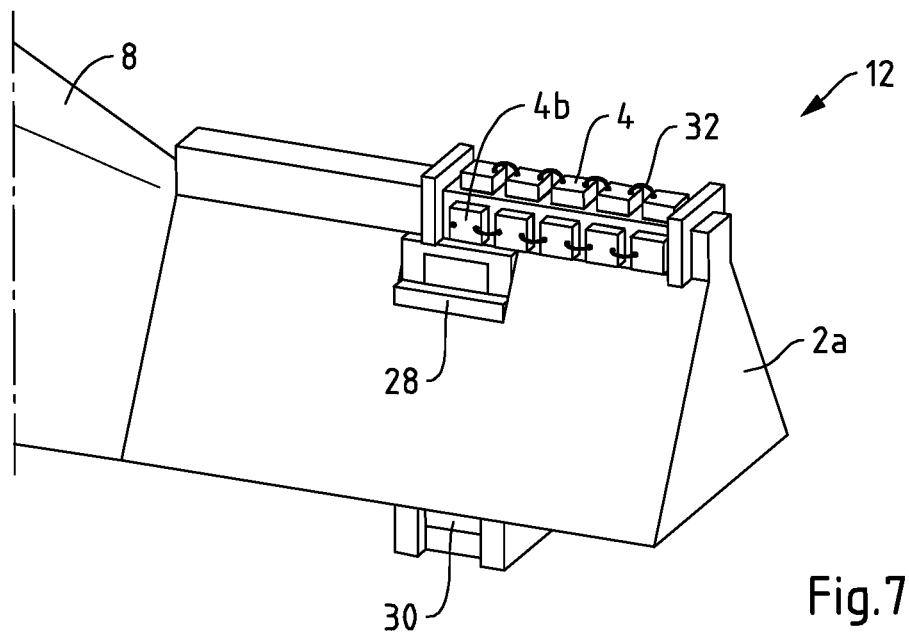

In a fourth step shown in FIG. 7d, preferably, a pre-molded package 28 or a PCB 14 are press fitted inside a respective receiving portion, e.g. of a copper carrier cavity 10. The inserted pre-molded package 28 or the inserted PCB 14 are shown in FIG. 7e.

Figure 7F:
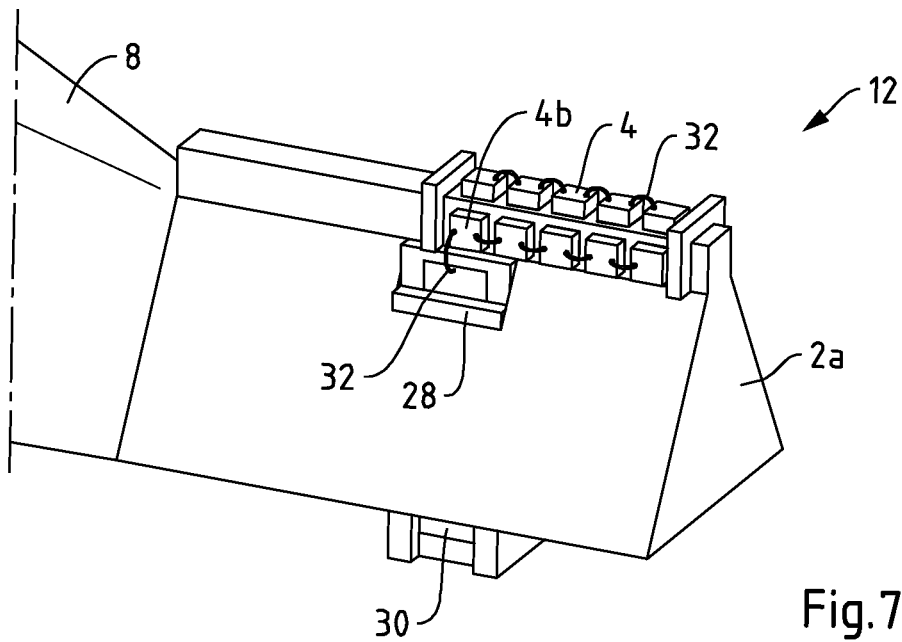

In a fifth step shown in FIG. 7f, the first and the last top contact chip 4a and 4b are connected electrically to contact sections being located adjacent to the first and the last top contact chip 4a and 4b when the pre-molded package 28 or the PCB 14 is inserted into a respective cavity 10 of the carrier 2. The contact sections may be metal pads of the pre-molded package 28 or metal pads of the PCB 14.

Figure 7G:
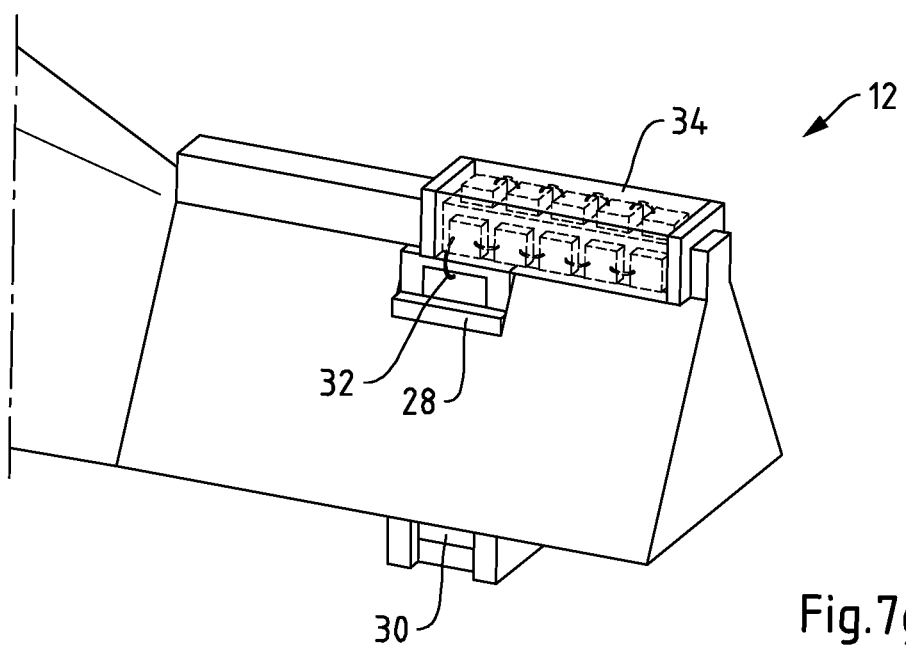

In a sixth step shown in FIG. 7g, finally, phosphor 34 is dispensed inside the heat-sink cavity surrounding the top contact chips, wherein the phosphor adjoins the small walls defining space for the respective phosphor converter by the dispensed phosphor 34.

FIG. 8a shows a schematic representation of another embodiment of a lighting device of the second aspect in a left side view. FIG. 8b shows the same embodiment in a right side view, and FIG. 8c shows the embodiment in a back side view. The lighting device 12 comprises lighting module packages 26 on three sides of the mounting portion 6. The lighting module packages 26 may comprise LEDs. Ideally, all of the lighting module packages 26 are electrically connected in series. Alternatively, all of the lighting modules comprised by a single lighting module package 26 are electrically connected in series, and the lighting module packages 26 on each of the mounting faces are electrically connected in parallel. In the first case, the electrical connection in series between lighting modules of two different mounting faces may be enabled by a pre-molded package 28, or a PCB 14. Thus, the nose 2a may comprise more than one cavity so that more than one pre-molded package 28, or a PCB 14 can be attached to the lighting device 12. According to an example embodiment of all aspects, the lighting device 12 comprises as many cavities 10 (e.g. slots) as needed for inserting a respective pre-molded package 28, or a PCB 14 into the respective cavity 10. The trade-off for such a plurality of cavities may be reduced thermal cooling provided by the carrier 2. Additionally or alternatively, the electrical connection between lighting modules of two different mounting faces may be enabled by one or more cables, such as shown cables 36a and 36b.

FIG. 9 shows a schematic representation of another embodiment of a lighting device of the second aspect in a front view. In the upper shown part of the mounting portion 6, the lighting device 12 comprises multiple, at present four, lighting modules 4c that can emit light with a different intensity than the multiple, at present four, lighting modules 4d that are shown on the lower part of the mounting portion 6. The lighting modules 4c are configured to enable low beam light e.g. of an automotive headlamp when they are driven, and the lighting modules 4d are configured to enable high beam light e.g. of an automotive headlamp when they are driven.

In the solution as proposed in example embodiments according to all exemplary aspects of the present invention a metal wall supporting lighting modules (e.g. LEDs) may be replaced by a non-conductive tile in ceramic, to name but one non-limiting example. However, to ensure the proper radiation characteristic, e.g. lighting module packages (e.g. LED packages) have to be disposed on at least three sides. This can be done e.g. by several metallic parts connected via a thermal paste not electrically conductive, to name but one non-limiting example. But taking into account the space constraint, it is challenging to connect mechanically and thermally three or even four very small metallic parts and isolate them electrically. Therefore, it is proposed to use a monolithic ceramic substrate.

For efficient heat transport, it is important that heat flow does not cross a thermal barrier in the area surrounding the lighting modules (e.g. LEDs). For this purpose, attachment of the substrate (e.g. ceramic tile comprising three copper routing layers) has to be done only with a thermal interface with a low thermal resistance. This is done preferably with solder paste connecting electrically a bottom copper routing layer of the ceramic tile with the copper carrier. Typically, thermal conductivity of the interface material should not be lower than 50 W/mK and thickness should not be more than 200 μm. as thermal interface alternative, glue filled with high content of silver or Ag sintering are also possible. Advantage of using such a ceramic tile is that electrical insulation between LEDs is not needed on the bottom side of the ceramic tile. The ceramic tile could be therefore directly connected with a full area electrical and thermally conductive interface (e.g. thermal interface 21).

REFERENCE SIGNS 2 carrier
2a nose
4 lighting module
4a first lighting module
4b last lighting module
4c low beam lighting modules
4d high beam lighting modules
6 mounting portion
6a first mounting face
6b second mounting face
6c third mounting face
8 heat sink body portion
10 cavity
12 lighting device
14 circuit board
16 structure
18 arrangement direction 21 thermal interface
22 ceramic substrate
23 ceramic tile
24a top routing layer
24b bottom routing layer
24c third/side routing layer
25 solder attach
26 lighting module package
27 wafer
28 pre-molded package
30 connector
32 wire-bond
34 phosphor
36a, b cable
α opening angle

What is claimed is:

1. A lighting device comprising:
   at least one carrier having a triangular cross section and comprising:
      at least one mounting portion on an edge of the triangular cross section, the at least one mounting portion comprising at least three mounting faces, and
      a heat sink body portion adjacent and protruding sidewards from the at least one mounting portion; and
   at least one lighting module mounted on each of the at least three mounting faces.

2. The lighting device of claim 1, wherein each of the at least three mounting faces comprises at least one mounting face contact section electrically coupled between at least two of the at least three mounting faces.

3. The lighting device of claim 1, wherein the at least three mounting faces are arranged adjacent to each other.

4. The lighting device of claim 1, wherein the at least three mounting faces are at an angle to each.

5. The lighting device of claim 1, wherein the at least three mounting faces are substantially parallel to each other.

6. The lighting device of claim 1, wherein a middle one of the at least three mounting faces has an enclosing angle of 45° to 135° with respect to the other two of the at least three mounting faces.

7. The lighting device of claim 1, wherein the at least one lighting module comprises a plurality of lighting modules, and each of the at least three mounting faces is electrically coupled to at least two of the plurality of lighting modules.

8. The lighting device of claim 7, further comprising a ceramic substrate thermally coupled to the at least one mounting portion.

9. The lighting device of claim 8, further comprising:
   at least one top routing layer,
   at least one bottom routing layer, and
   at least one third routing layer on a side of the ceramic substrate between the at least one top routing layer and the at least one bottom routing layer,
   the at least one top routing layer, the at least one bottom routing layer, and the at least one third routing layer electrically coupling at least two of the plurality of the lighting modules in series.

10. The lighting device of claim 8, wherein:
    the at least one lighting module comprises at least three lighting module packages, each of the at least three lighting module packages comprising multiple top contact chips and being thermally coupled to each of the at least three mounting faces, and
    each of the at least three mounting faces is electrically coupled in series via the at least one mounting face contact section of each of the at least three mounting faces.

11. The lighting device of claim 10, further comprising:
    at least one pre-molded package or at least one circuit board electrically coupling a first lighting module and a last lighting module of the multiple lighting modules with a connector to drive the at least three lighting module packages.

12. The lighting device of claim 9, wherein the at least one pre-molded package or the at least one circuit board is configured to be coupled with the first lighting module and the last lighting module of the multiple lighting modules via a lead frame.

13. The lighting device of claim 7, wherein at least one lighting module of the multiple lighting modules is configured to emit light of a different intensity than at least one other lighting module of the multiple lighting modules.

14. A method of manufacturing a lighting device comprising:
    providing a carrier having a triangular cross section and comprising at least one mounting portion on an edge of the triangular cross section, the at least one mounting portion comprising at least three mounting faces;
    thermally coupling a heat sink body portion to the at least one mounting portion of the carrier such that the heat sink body portion protrudes sidewards from the at least one mounting portion; and
    mounting at least one lighting module on each of the at least three mounting faces.

15. The method of claim 14, further comprising, prior to mounting the at least one lighting module:
    providing a ceramic substrate comprising a top routing layer and a bottom routing layer, the ceramic substrate comprising multiple sections of ceramic tiles that are separable from each other and arranged in at least one of rows or columns;
    forming a ceramic strip of the multiple sections of ceramic tiles;
    depositing a third routing layer on a side between the top routing layer and the bottom routing layer; and
    forming a monolithic ceramic tile of the ceramic strip.

16. The method of claim 14, further comprising:
    forming the heat sink body portion integrally with the at least one mounting portion;
    mounting three respective lighting module packages comprising multiple top contact chips on each of the three mounting faces; and
    electrically coupling the multiple top contact chips of each of the lighting module packages in series.

17. The method of claim 16, further comprising:
    mounting a pre-molded package or a circuit board to the carrier, the pre-molded package comprising a lead frame.

18. The method of claim 17, further comprising:
    arranging the pre-molded package or the circuit board in at least one cavity of the carrier; and
    electrically coupling a first lighting module and a last lighting module of the three lighting module packages with the pre-molded package or the circuit board.

* * * * *